United States Patent
Longoni et al.

(10) Patent No.: US 8,548,775 B2
(45) Date of Patent: Oct. 1, 2013

(54) METHOD FOR DESIGNING AND/OR SELECTING A DEVICE AND/OR MATERIAL FOR IMPLANTING IN TISSUES OF THE HUMAN OR ANIMAL BODY AND A DEVICE AND/OR MATERIAL OBTAINED THEREBY

(75) Inventors: Salvatore Longoni, Milan (IT); Matteo Sartori, Milan (IT); Damiano Vitulli, Rome (IT)

(73) Assignees: Salvatore Longoni (IT); Matteo Sartori (IT)

( * ) Notice: Subject to any disclaimer, the term of this patent is extended or adjusted under 35 U.S.C. 154(b) by 451 days.

(21) Appl. No.: 12/990,318

(22) PCT Filed: May 22, 2009

(86) PCT No.: PCT/EP2009/056243
§ 371 (c)(1), (2), (4) Date: Oct. 29, 2010

(87) PCT Pub. No.: WO2009/141435
PCT Pub. Date: Nov. 26, 2009

(65) Prior Publication Data
US 2011/0060560 A1   Mar. 10, 2011

Related U.S. Application Data

(60) Provisional application No. 61/091,450, filed on Aug. 25, 2008.

(30) Foreign Application Priority Data

May 23, 2008  (IT) ............................... MI2008A0967

(51) Int. Cl.
*G06F 17/50* (2006.01)

(52) U.S. Cl.
CPC ..................................... *G06F 17/50* (2013.01)
USPC .............................................. 703/1; 382/100

(58) Field of Classification Search
USPC ...................................... 703/1; 382/100, 128
See application file for complete search history.

(56) References Cited

U.S. PATENT DOCUMENTS

| 5,628,630 | A | 5/1997 | Misch et al. | |
|---|---|---|---|---|
| 6,430,427 | B1 * | 8/2002 | Lee et al. | 600/407 |
| 7,215,803 | B2 * | 5/2007 | Marshall | 382/128 |
| 8,206,153 | B2 * | 6/2012 | Suttin et al. | 433/215 |

(Continued)

FOREIGN PATENT DOCUMENTS

| WO | 2004/086972 | 10/2004 |
|---|---|---|
| WO | 2007/074498 | 7/2007 |

OTHER PUBLICATIONS

Won-Jin Yi et al., "Direct measurement of trabecular bone anisotropy using directional fractal dimension and principal axes of inertia," Oral Surgery, Oral Medicine, Oral Pathology, Oral Radiology Andendodontics, Mosby-Year Book, St. Louis, MO, vol. 104, Issue 1, Jul. 1, 2007, pp. 110-116. (Abstract only).

(Continued)

*Primary Examiner* — Eunhee Kim
(74) *Attorney, Agent, or Firm* — Cantor Colburn LLP

(57) ABSTRACT

A method for designing a device and/or bio material for implanting in tissues of the human or animal body, comprising the acquisition of a digital image of the structure of the recipient tissue and its breakdown and processing in fractal elements that enable the classification of the type of tissue and the design of the device and/or biomaterial so as to achieve an optimal coupling for the purposes of the integration and the stability of the implant in the tissue. An automatic and simplified procedure is also described, based on the analysis of the image of the tissues with a view to providing indications on the most suitable device and/or biomaterial to choose for a implant.

16 Claims, 22 Drawing Sheets

(56) References Cited

U.S. PATENT DOCUMENTS

| | | |
|---|---|---|
| 2002/0196966 A1 | 12/2002 | Jiang et al. |
| 2005/0060039 A1 | 3/2005 | Cyprien |
| 2006/0062442 A1* | 3/2006 | Arnaud et al. ............... 382/128 |
| 2008/0031412 A1* | 2/2008 | Lang et al. ..................... 378/54 |

OTHER PUBLICATIONS

International Search Report—PCT/EP2009/056243 dated Nov. 25, 2009.

Written Opinion—PCT/EP2009/056243 dated Nov. 25, 2009.

* cited by examiner

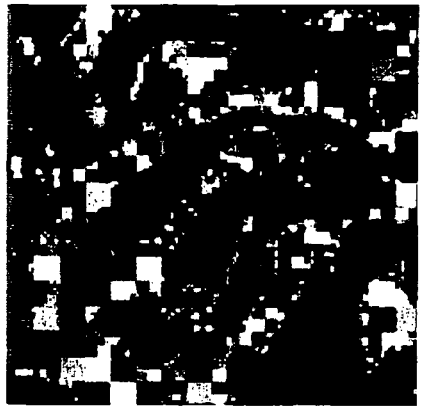

FIG. 3

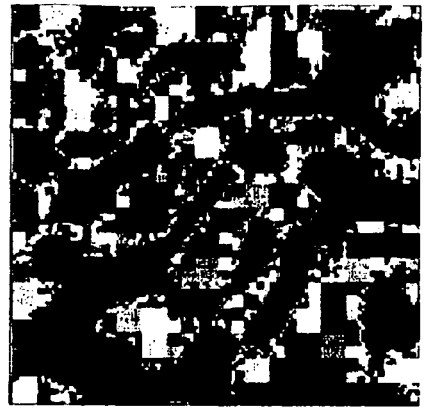

FIG. 4

Level: 0 - 512 pixels – Qty of nodes: 0 – Weight: 0.0%
Level: 1 - 256 pixels – Qty of nodes: 0 – Weight: 0.0%
Level: 2 - 128 pixels – Qty of nodes: 0 – Weight: 0.0%
Level: 3 - 64 pixels – Qty of nodes: 3 – Weight: 4.69%
Level: 4 - 32 pixels – Qty of nodes: 37 – Weight: 14.45%
Level: 5 - 16 pixels – Qty of nodes: 151 – Weight: 14.75%
Level: 6 - 8 pixels – Qty of nodes: 301 – Weight: 7.35%
Level: 7 - 4 pixels – Qty of nodes: 532 – Weight: 3.25%
Level: 8 - 2 pixels – Qty of nodes: 932 – Weight: 1.42%
Level: 9 - 1 pixels – Qty of nodes: 128 – Weight: 0.05%

Width of best binary fit: 512 pixels
Height of best binary fit: 512 pixels
Total area of best binary fit: 262144 pixels
Width: 512 pixels
Heoght: 512 pixels
Total area: 262144 pixels
Filling in: 120464 pixels
Percentage of filling in: 45.95%

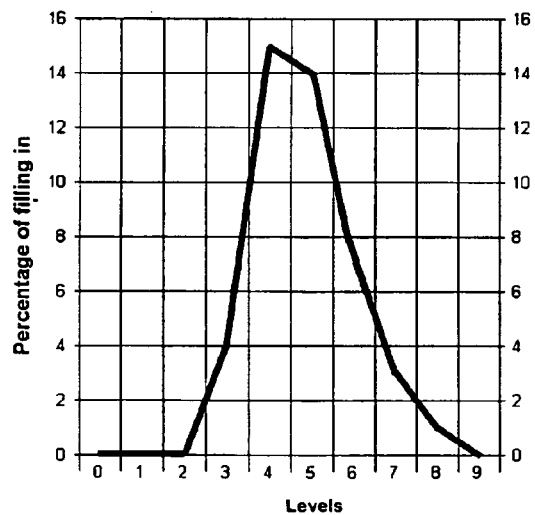

FIG. 5

  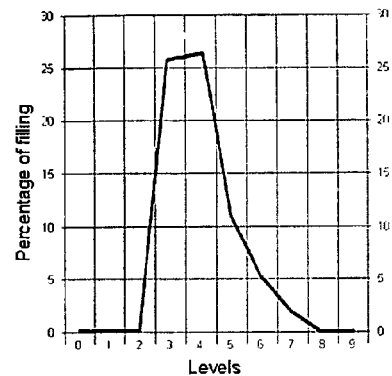
FIG. 6A　　　FIG. 6B　　　　　FIG. 6C
 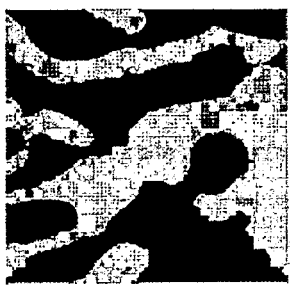 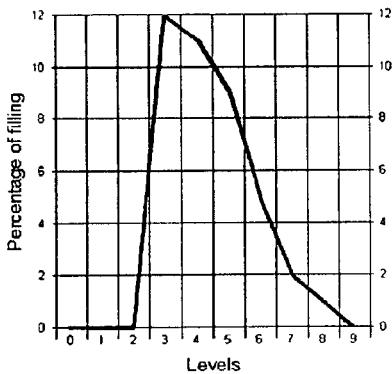
FIG. 7A　　　FIG. 7B　　　　　FIG. 7C
 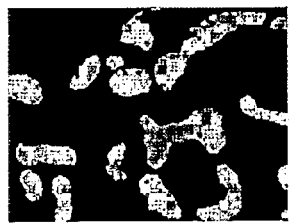 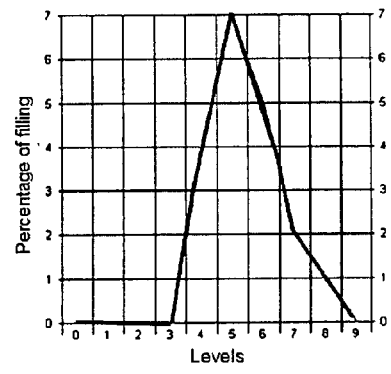
FIG. 8A　　　FIG. 8B
FIG. 8C

METHOD FOR DESIGNING AND/OR SELECTING A DEVICE AND/OR MATERIAL FOR IMPLANTING IN TISSUES OF THE HUMAN OR ANIMAL BODY AND A DEVICE AND/OR MATERIAL OBTAINED THEREBY

BACKGROUND OF THE INVENTION (1) Field of the Invention

The present invention relates to a method for designing and/or selecting a device and/or a material for implanting in tissues of the human or animal body, and to the device and/or material obtained thereby.

More in particular, the invention relates to a method for designing dental implants and filler materials for the endogenous repair of bone cavities, and extends to dental implants and filler biomaterials obtained thereby.

(2) Description of Related Art

The treatment of certain diseases involves inserting and implanting filler materials or devices inside organs or tissues of the human or animal body. In odontoiatrics, for instance, lost or diseased original teeth can be replaced by prostheses that can be attached to endosseous implants that substitute the missing root. In other fields of surgery, use is made of endosseous fixing screws to fuse vertebrae, or of devices such as stents, which consist of hollow cylindrical mesh elements capable of assuring the patency of biological lumens, such as arteries, veins, bile ducts, oesophagus, colon, trachea, ureter, urethra, etc. In all such cases, the device implanted or inserted in the organ or tissue of interest must subsequently become successfully integrated and stable within the structure and the surrounding tissue.

In the case of endosseous dental implantology, the implant must be stable enough to withstand the masticatory loads, and must consequently enable the onset of a rapid and effective process of osteointegration. The quantity, quality and duration of said osteointegration process depends on the nature of the surface of the implant.

In the case of stents, and of vascular stents in particular, integration with the tissue of the coronary vessels must not only be complete and effective, but must also avoid any excessive growth of neointimal tissue, which can cause restenoses, i.e. re-occlusion of the vessel. This process is also influenced by the nature of the surface of the stent.

Guided bone regeneration (GBR) using filler materials—known in the sector as "biomaterials"—is a technique that has been consolidated by decades of surgical experimentation. These biomaterials are used to regenerate biological tissues, and particularly for bone regeneration in sectors such as orthopaedics, traumatology, spinal surgery, maxillofacial surgery and odontoiatrics.

The pharmaceutical industry and laboratories specialising in biotechnologies have fine-adjusted four basic product categories, i.e. conditioned human bone, conditioned animal bone, natural biomaterials and synthetic biomaterials.

The endogenous repair of bone cavities through endogenous bone formation is a natural physiological event. The animal body is equipped with a complex self-repair system, such that damage to the various body tissues can be repaired, within feasible limits, by means of a reconstruction process. The purpose of all pharmacological processes and surgical procedures implemented on a living organism is to guide the natural physiological processes that lead to healing, or to create the conditions that make healing possible.

A healing process can be facilitated and guided (GBR) by using filler biomaterials that stimulate the natural endogenous formation of new bone tissue. The biomaterials available on the market, be they of natural or synthetic origin, are characterised by a particular morphology that depends on the tissue from which they are derived, or on the substance used to produce them. This morphology is of fundamental importance, so a biomaterial made according to the present method could be better suited to the morphology of the recipient tissue and thus positively influence the response and the healing process of the tissue concerned.

As regards endosseous dental implantology, the patent literature describes various types of implant and methods for their design and manufacture, intended to improve the process of osteointegration and, more in general, to improve the quality and functionality of the implant.

U.S. Pat. No. 5,628,630 (Misch et al.) describes a method for designing skeletal implants in order to optimising the cell response. The implant consists of a screw-in mot and the method for designing the implant entails a macro-design stage and a micro-design stage. The latter involves determining the elastic modulus of the bone, which is then used in a series of strain equations adopted in the design of the implant so as to ensure that the entity of the strains induced by the implant comes between 100 and 3,000 microstrain. The method also includes a classification of trabecular bone in various groups as a function of its density.

The US patent application 2005/0060039 A1 describes a glenoid prosthesis with a serrated surface having a fractal structure to increase its adhesion to the cementing material and consequently to the bone.

The international patent application WO 2007/074498 describes the shape of a screw for an endosseous dental implant. The surface of the interface between the implant and the surrounding bone is—among other things—increased by creating engravings structured according to fractal geometry.

The US patent application 2002/0196966 A1 describes a method and a computer-assisted system for analysing the mass and structure of a bone. The method is based on obtaining digital images of the bone and measuring the bone mineral density and other parameters, including the Minkowski index. Among other things, the method describes the use of fractal analysis to characterise the trabecular structure of a bone.

U.S. Pat. No. 6,430,427 B1 describes a method for obtaining a trabecular index using a model and a trabecular method for estimating bone mineral density. The method analyses variations in the trabecular structure due to decalcification in order to obtain indices that are subsequently used to estimate bone mineral density.

The article by Yi W J, M. Heo, S. Lee, S. Choi, K. Huh, S. Lee; "Direct measurement of trabecular bone anisotropy using directional fractal dimension and principal axes of inertia"; Oral Surgery, Oral Medicine, Oral Pathology, Oral Radiology, and Endodontology; Volume 104, Issue 1, Pages 110-116, 26 Mar. 2007, describes the directional anisotropy of the fractal structure of trabecular bone and its use to study the mechanical properties of the bone in various regions of the mandible.

Although some of the above-described methods enable useful information to be obtained on the structure of biological organs and tissues destined to receive implants, and particularly of osseous structures, these methods do not enable the design and preparation of implants or devices with a structure morphologically consistent with the biological structure receiving the implant, with a view to achieving a structural complementarity that ensures its effective integration in the recipient structure. Moreover, these known methods are often complicated, so they are not easy to adopt in surgical practice, and in dental practice in particular.

BRIEF SUMMARY OF THE INVENTION

A first object of the invention is consequently to provide a method for designing a device for inserting or implanting in tissues of the human or animal body that is morphologically consistent with the structure of the recipient organ or tissue so as to obtain a structural complementarity that ensures its effective integration in the recipient structure.

Another object of the present invention is to provide a device for implanting in tissues of the human or animal body designed using the above-mentioned method and consequently capable of optimal integration in the recipient biological structure, as well as assuring a maximal duration and excellent functionality.

Another object of the invention is to provide a method for designing a device for implanting in bone tissues of the human or animal body that is morphologically consistent with the recipient bone structure, so as to achieve a structural complementarity that ensures an effective osteointegration and a maximal duration of the implant.

Another object of the invention is to provide a method for designing a dental implant morphologically consistent with the structure of the recipient bone, so as to achieve a structural complementarity that ensures an effective osteointegration.

Another object of the invention is to provide a dental implant designed according to the above-described method.

Another object of the invention is to provide a biomaterial, and particularly a filler biomaterial for the endogenous formation of new tissue in the human or animal body, that is morphologically similar to the structure of the recipient tissue, so as to obtain a structural complementarity that ensures an effective and rapid integration of the biomaterial in the surrounding tissue.

The above and other objects and advantages of the invention, which will emerge from the description that follows, are achieved by a method for designing a device or material for implanting in tissues of the human or animal body characterised in that it comprises the following stages:

a) acquiring a digital image of the structure of a tissue destined to receive a device or implant, said image identifying areas of tissue with a different density of matter;

b) calibrating the colour level of said areas of tissue with a different density of matter, which comprises assigning a first colour level to the areas of tissue with the greatest density of matter (dmax) and a second colour level to the areas of tissue with the least or no density of matter (dmin), referring said maximum (dmax) and minimum (dmin) density of matter values to the type and location of said tissue;

c) calculating the colour level of said image, which comprises assigning said first colour level if the image contains at least 60%, and preferably at least 90% or, better still, at least 95% of said first colour, or assigning said second colour level if the image contains no more than 40%, and preferably no more than 5% or, better still, no more than 2% of said first colour; or dividing said image into four quadrants if the image contains between 60% and 40%, and preferably between 90% and 5% or, better still, between 95% and 2% of said first colour;

d) calculating, where necessary, the colour level of each of said four quadrants obtained at the previous stage c), which comprises assigning said first colour level or assigning said second colour level, or further dividing each quadrant into four quadrants using the same assignment criteria as described in said stage c);

e) iterating said stage d) in order to obtain quadrants of sufficiently small dimensions in relation to the dimensions of said device or implant;

f) assigning an arbitrary colour to all the quadrants of the same size;

g) calculating the total number of quadrants to which said first colour level has been assigned, which corresponds to the areas of tissue with the greatest density of matter and expressing said number of quadrants as a percentage of said image of the structure of said tissue, and calculating the number of quadrants for each level of recursion and the percentage weight of each level of recursion in relation to the total; calculating the total number of quadrants to which said second colour level has been assigned, which corresponds to the areas of tissue with the least or no density of matter and expressing said number of quadrants as a percentage of said image of the structure of said tissue, and calculating the number of quadrants for each level of recursion and the percentage weight of each level of recursion in relation to the total;

i) analysing the quadrants obtained at said previous stages, which comprises determining the clusters of adjacent quadrants that have said first colour level corresponding to the areas of tissue with a high density of matter, and the clusters of adjacent quadrants that have said second colour level corresponding to the areas of tissue with a low or no density of matter;

l) generating artificial clusters of quadrants with geometrical characteristics that reproduce or approximate the characteristics of said clusters of adjacent quadrants identified at stage i);

m) designing said device and/or material for implanting in tissues of the human or animal body using the characteristics identified at said stage l).

Preferably, a further stage h) is provided so that to carry out a classification of said tissue in n classes as a function of said percentage of areas of tissue with the greatest density of matter, of said percentage of areas of tissue with the least or no density of matter, and of the percentage distribution of the quadrants of different dimensions obtained at the previous stages, wherein stage m) uses even the characteristics established by said stage h).

Another aspect of the invention concerns a device for implanting in tissues of the human or animal body characterised in that it comprises an outer surface with a structure at least partially complementary to the structure of the area of tissue with which it is to come into contact in use.

Another aspect of the invention concerns a material for implanting in tissues of the human or animal body characterised in that it comprises a structure morphologically consistent with the structure of the area of tissue with which it is to come into contact.

The tissue of the human or animal body is preferably bone tissue.

The device for implanting in tissues of the human or animal body is preferably a dental implant device.

The material for implanting in tissues of the human or animal body is preferably a filler biomaterial for endogenous bone reconstruction, particularly for use in odontoiatrics and maxillofacial surgery. The term "biomaterial" is used to mean a material compatible with and complementary to the tissues of the human or animal body and suitable for sustaining and guiding the repair processes of said tissues. Examples of biomaterials include: hydroxyapatite, β-tricalcium phosphate, calcium sulphate, bone of animal origin (bovine, equine, porcine).

BRIEF DESCRIPTION OF THE DRAWINGS

The invention is explained below with reference to the attached figures, given as non-limiting examples, wherein:

FIGS. 3 and 4 are images derived from the breakdown of the image in FIG. 2;

FIG. 5 shows a graph relating to the method of the invention;

FIGS. 6A, 7A and 8A are images of different human maxilla and mandible bone tissues;

FIGS. 6B, 7B and 8B are images obtained from the breakdown of the images in FIGS. 6A, 7A and 8A;

FIGS. 6C, 7C and 8C show graphs relating to the method of the invention;

DETAILED DESCRIPTION OF THE INVENTION

Figure 1:
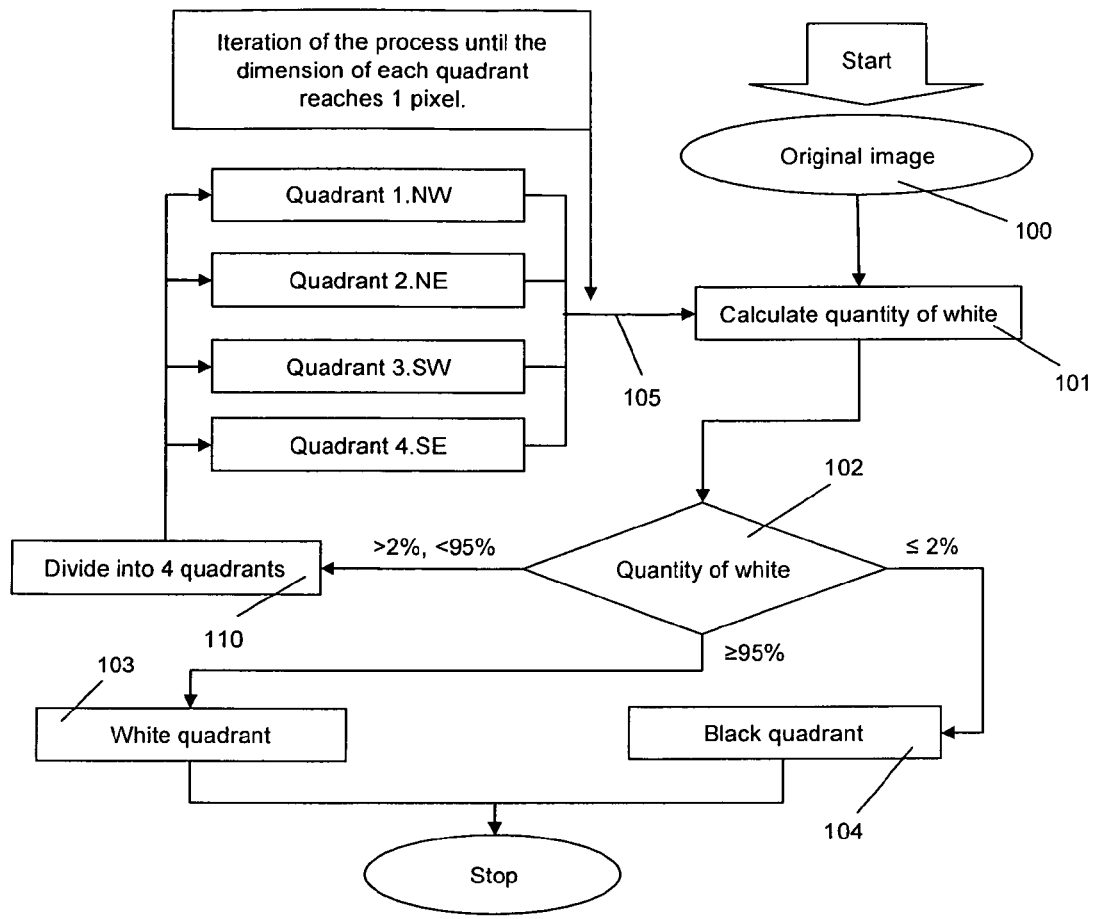
FIG. 1 is a flow chart of a preferential embodiment of several stages of the method according to the invention.

The method according to the invention preferably enables the design of dental implants, but also of devices such as stents for implanting in non-osseous tissues, e.g. in biological lumens such as arteries, veins, bile ducts, oesophagus, colon, trachea, ureter, urethra, and the like.

As concerns dental implants, ever since its birth (Branemark 1969), oral implantology based on osteointegration has undergone a progressive evolution regarding the dental implants, surgical procedures, prosthetic techniques and correlated diagnostic methods. The evolution of dental implants in general has always taken place on several levels. It affects the materials, the morphology of the implants and the surface of the implants. As concerns the materials, by far the most commonly-used material on an international scale is titanium and its alloys.

The morphology of the implant guarantees its primary stability and enables the osteointegration process to develop. After osteointegration has been achieved, the morphology of the implant determines the distribution of the masticatory loads in the surrounding bone. The majority of the implants produced have a cylindrical-conical morphology with or without a thread and means for anchoring the prosthesis thereon.

The surface of the implant affects the dynamics of the of osteointegration process in terms of quantity, quality and duration. The surfaces of the first implants were smooth, but a great variety of modified surfaces subsequently became available on the market, obtained by adding or subtracting material at micrometric and/or nanometric level.

Dental implants last roughly 10-15 years. Their duration depends largely on functional load, oral hygiene, and the morphology and surface of the implant.

The known dental implants are basically screws that have been perfected over the years on the strength of mechanical, clinical and biological indications. The cognitive and research process undertaken in the design and manufacture of dental implants has mainly concerned adapting the screw to the surrounding environment, i.e. to the structure of the bone tissue.

In particular, a number of mechanical modifications have been introduced with time, concerning the morphology of the screw thread, the global design of the implant and the means for connecting the prosthesis. The greatest innovation, however, has concerned the progressive passage from smooth implant surfaces to rough implant surfaces. The rough implant surfaces obtained by adding and/or subtracting material now serve the purpose of attracting the organic fluids contained in the bone and thus increase the wettability of the implant, thereby reducing the time it takes for osteointegration to take place and creating a greater contact area at the bone-implant interface.

The method of the present invention is based conceptually on the following fundamental aspects:
 the mathematical and geometrical analysis of the macroscopic and microscopic morphology of the bone;
 the classification of the maxillary and mandibular bone tissue:
 the design of the implants on the strength of said classification to obtain a micro- and macro-geometry that camouflage the implant within the bone, determining an intimal contact between the two.

The object is to improve the performance of the implants thus designed, both in the initial stage when the process of osteointegration develops, and afterwards, in terms of the duration of the prosthesis-implant rehabilitation period. Generally speaking, a good bone density is associated with a higher implant success rate than a scarce bone density.

As for the quality of the maxilla and mandible bone tissue, various classifications have been proposed over the years. These are briefly summarised below.

In 1970 Linkow classified three categories of bone density:

Class I bone structure: the ideal type of bone, with an evenly-spaced trabecular framework and small spaces;

Class II bone structure: with slightly larger spaces and a less uniform trabecular framework;

Class III bone structure: with the trabecular framework delimiting very large spaces. In 1985 Lekholm and Zarb listed four different qualities of bone:

Type 1: homogenous compact bone;

Type 2: a compact layer of cortical bone surrounds a core of dense trabecular bone;

Type 3: a thin layer of cortical bone surrounds a core of dense trabecular bone;

Type 4: a thin layer of cortical bone surrounds a core of low-density trabecular bone. In 1988 Misch extended this classification:

Bone D1: dense cortical bone;

Bone D2: thick, dense cortical and dense trabecular bone;

Bone D3: thin cortical and dense trabecular bone;

Bone D4: thin cortical surrounding low-density trabecular bone;

Bone D5: immature and demineralised bone.

In 1995 Friberg introduced the assessment of the bone's intra-operative cutting resistance.

In 1999 Trisi and Rao correlated the bone's cutting with the histological findings.

In 2001 Norton and Gamble introduced a classification starting from CT scan data, based on the Hounsfield scale.

These classifications are based on empirical clinical experience, intra-operative and radiographic findings, and trials conducted on autoptic anatomical tissues.

The method according to the invention involves first investigating, identifying and classifying the structure of the tissues where the device is to be implanted or placed, then designing the device in the light of the characteristics of the structure of the tissues where the device is to be implanted or placed.

It comprises the stages listed in claim 1.

Stage a) comprises the acquisition of an image of the structure, preferably of a fine structure, of a tissue destined to receive a device or implant, said image identifying areas of tissue with a different density of matter. The term "fine structure" is used here to mean that the image must represent the area of tissue where the device is to be implanted or inserted in sufficient detail and with an adequate definition. The image is obtained by means of x-ray radiography, histology, microscopy, or other suitable techniques, and is digitalised for subsequent processing, or acquired directly in digital form.

The term "areas of tissue with a different density of matter" also includes the areas of tissue in which there is no matter. For instance, in the case of porous tissues such as trabecular bone tissue, the bone trabeculae occur alternately with voids. The image thus identifies the presence of areas of bone and empty areas.

Stage b) involves the calibration of the colour level of the areas of tissue with a different density of matter. Basically, a first colour level is attributed to the areas of tissue with a high density of matter and a second colour level is assigned to the areas of tissue with a low or no density of matter. The choice of these areas depends on the type of tissue and on the type of implant. For example, the colour white is attributed to the areas with a high density of matter, such as the bone trabeculae, while the areas of low or no density of matter, such as the voids, are assigned the colour black.

The term "high density of matter" consequently means areas of substantially compact or scarcely porous tissues, while the term "areas of tissue with a low or no density of matter" means areas containing voids or highly porous tissues.

Stage c) consists in calculating the colour level of the image acquired at stage a). Assuming that the first colour level is white and corresponds, for instance, to the bone trabeculae, and that the second colour level is black and coincides with the voids, the image is assigned to the colour white if it contains at least 60%, and preferably at least 90% or, better still, at least 95% of white, or to the colour black if it contains no more than 40%, and preferably no more than 5% or, better still, no more than 2% of white. On the other hand, if it contains a percentage of white coming in between the above-mentioned values, the image is divided into four quadrants and the above-described calculation is applied to each of them. In other words, if the image contains between 60% and 40%, and preferably between 90% and 5% or, better still, between 95% and 2% of white, it is assigned to neither white nor black; instead, it is divided into four quadrants to enable the colour to be assigned on a more limited scale, using the same criteria as explained above. The four quadrants, or fractal elements, thus obtained are consequently geometrical entities that will be similar to one another at each successive reduction in their dimensions.

Stage d) includes calculating the colour level of each of the four quadrants obtained at the previous stage c), that could not be assigned the colour white or black because they included a percentage of white coming in between the above-defined ranges. If it likewise proves impossible to assign the colour white or black to one or more of said quadrants, the calculation procedure is reiterated, as explained in stage e), until quadrants of sufficiently limited dimensions are obtained in relation to the size of the device to be implanted. The term "sufficiently limited dimensions" preferably means quadrants with a dimension of one pixel. The reiterated process of colour assignment and division into quadrants is computerized using a suitable algorithm called Recursive Quadrant Analysis (RQA), as illustrated schematically in FIG. 1.

The RQA algorithm creates what, in the software technology sector, is called a Quadtree: this is a data tree structure in which each node has four branches. The Quadtree is used to partition a 2-D space by dividing it recursively into four quadrants. These quadrants are generally in the shape of a square or rectangle. The rule in the recursive phase for deciding whether a quadrant must be further divided depends on the to in which the Quadtree is applied. The Quadtree can also be represented by means of a tree structure in which each node can have up to four branches. Based on this definition, the RQA algorithm can be seen as a particular application of the Quadtree in which a grey-scale image is partitioned on the basis of a calculation of the number of pixels that have reached a given threshold value. Associating the information thus obtained (recursion level/number of quadrants) on a Cartesian reference system enables a study based on a comparison of the graphs obtained using images of different density/raggedness.

In FIG. 1 an example of algorithm RQA is presented. In this case, it is considered that RQA is applied for searching for white pixels in an image, but it can be used for searching for black pixels in the same image or, in case of a colour image, it could be used for searching for a determined colour. As illustrated by FIG. 1, the RQA algorithm has as an input an original image represented as a pixel matrix 100, each pixel being characterized by its colour (e.g. white/black). After calculation (process 101) of the quantity of white colour within the original image, a choice (process 102) is made according to the following possibilities:

- at least 95% of the pixels of the original image are white pixels: in this case, the all original picture is deemed to be white (103);
- 2% or less of the pixels of the original image are white pixels: in this case, the all original picture is deemed to be black (104);
- between 2% and 95% of the pixels of the original image are white: in this case, four quadrants (to which reference is made with NW, NE, SW, SE for analogy with cardinal points) are generated, the pixel matrix of the original is split in four pixel matrixes (process 110); then, (105), for each of said quadrants (NW, NE, SW, SE), the RQA algorithm is recursively repeated (that means that each quadrant can be deemed to be wither white, black or split in four new sub-quadrants) until each possible quadrant has a colour; the smallest possible quadrant is a pixel.

At the end of the reiterations of RQA algorithm, every pixel of the original picture is part of either a black or a white quadrant.

In this way, the RQA is capable to remap the original image in a bunch of quadrants of various sizes.

Using sample images for calibration purposes, any greyscale image can thus be classified on the basis of its density/raggedness. If we consider the images of bone structures, especially when they represent the fabric of the bone with a high level of magnification, we can use this algorithm to extrapolate their fractal nature from the information on the raggedness of the bone (number of quadrants) at the various levels of magnification (recursion level).

The method thus leads to the breakdown of the image into increasingly small quadrants, or fractal elements, the dimensions of which are inversely proportional to the recursion level used to obtain them, i.e. the higher the recursion level, the smaller the dimensions of the quadrant, or fractal element. In stage f) a colour is arbitrarily assigned to all the fractal elements that have the same recursion level, i.e. the same dimensions, enabling us to distinguish the quadrants belonging to the same recursion level.

Figure 2:
FIG. 2 is an enlarged micro-radiographic image of a portion of human maxilla trabecular bone.

FIGS. 2, 3 and 4 show an example of the results obtained after stages a) to f) of the above-described method, but the method can obviously be applied to any image of any tissue at any level of magnification. FIG. 2, for instance, is a black and white image obtained by microradiography of bone biopsies. FIG. 3 shows the outcome of processing the image in FIG. 2 with the RQA algorithm. The areas of white, corresponding to the bone trabeculae, have been divided into quadrants or fractal elements, while the voids have been assigned to the colour black. The procedure can also work in the opposite direction, however: by changing the algorithm's basic parameters, the same breakdown procedure can be applied to the black areas corresponding to the voids between the trabeculae (FIG. 4).

Stage g) involves calculating the total number of fractal elements that have been assigned the colour white, which means the areas of tissue with a high density of matter, such as the bone trabeculae. We can also calculate the area occupied by the voids between the trabeculae (areas coloured black), the number of quadrants obtained at each recursion, and the percentage weight of the quadrants considered as white or black in the composition of the image. We can consequently express the percentage of white and black coverage in the original image. If we construct a graph to correlate the recursion level (abscissa axis) with the percentage coverage vis-a-vis the bounding box of the image (ordinate axis), we obtain a curve as shown in FIG. 5, from which we can see that the maximum level of coverage (approximately 36.5%) is obtained with fractal elements with a recursion level coming between 4 and 6.

Stage h) consists in classifying the tissue in n classes as a function of the proportions of white and black, and of the percentage weight of the quadrants of each recursion level in the breakdown, i.e. of the density of matter of the tissue and of the spatial distribution of the matter. For example, there may be two images that contain the same quantities of white and black, but differently distributed, i.e. the first image may contain only a few large quadrants, while the second has numerous medium-sized quadrants, or a very large number of small quadrants. The classification method is therefore more effective because it takes into account not only the quantities of the colours (white or black) but also their spatial distribution, and consequently distinguishes automatically between images with a gross resolution and images with a fine resolution, even though they may contain similar amounts of black and white. This method also provides better-quality information than the classic FD (Fractal Dimension) approach, which is only capable of providing information relating to the unevenness or raggedness of the image analysed.

With reference to FIG. 5, the graph shows the number and distribution of the quadrants corresponding, for instance, to the area with a high density of matter. The qualitative and quantitative characteristics of this area with a high density of matter can vary depending on:

1—the area occupied by the curve or integral
2—the height of the peak on the curve
2—the amplitude of the curve
3—the position of the curve along the abscissa axis, where a curve displaced to the left is characterised by lower recursion levels (larger quadrants), while a curve displaced to the right is characterised by higher recursion levels (smaller quadrants). A high percentage of white indicates a high density of matter and corresponds to very compact tissues, while a low percentage of white indicates a low density of matter and corresponds to very porous tissues. FIGS. 6, 7 and 8 show the situation relating to a good bone density, a moderate bone density and a poor bone density, respectively. Each figure is composed of three figures A, B and C, that respectively relate to the micro-radiographic image of the tissue biopsy (6A, 7A, 8A), its breakdown by means of the RQA algorithm (6B, 7B, 8B), and the graph showing the recursion level in relation to the percentage of coverage (6C, 7C, 8C).

FIG. 6 is an example of good bone density, with white occupying 71.24% of the image.

FIG. 7 is an example of moderate bone density, with white occupying 42.11% of the image.

FIG. 8 is an example of poor bone density, with white occupying 20.95% of the image. The above examples refer to a classification of the tissue in three classes depending on the proportion of white and black, i.e. on the tissue's density of matter, but it is clearly possible to classify the tissue in a different number of classes, preferably between 2 and 12 or, better still, between 3 and 8.

Stage i) involves analysing the quadrants obtained at the stage g) and determining the clusters of adjacent quadrants coloured white, corresponding to the areas of tissue with a high density of matter, e.g. bone tissue. The analysis can also be conducted in the opposite direction, i.e. on the clusters of quadrants coloured black and corresponding to the areas of tissue with a low or no density of matter. The image broken down with the RQA algorithm is thus further analysed to identify the number and structure of its component "islands". These islands are clusters of quadrants that are grouped together on the basis of their size and position according to a precise spatial hierarchy based on the assessment of the quadrants' dimensions and adjacency relationships. The procedure begins with the larger-sized quadrants, which represent the central nucleus of each island. The adjacent quadrants of smaller dimensions (or higher recursion levels) lying along their sides are associated with the larger quadrant and considered as belonging to the same island. When a given quadrant comes into contact with the island on a level with a corner (i.e. a contact that is not linear along its side) this means that said quadrant belongs to another island. The larger-sized quadrants thus represent the load-bearing element of each island, and they are surrounded by quadrants of progressively decreasing dimensions. All the quadrants belonging to a given island are identified by the same number, which corresponds to the number of the island in question. This analysis is conducted both for the colour white and for the colour black. The analysis is done by the computer using suitable algorithms for calculating Adjacencies and Islands, illustrated respectively in FIGS. 17 and 18.

Figure 17:
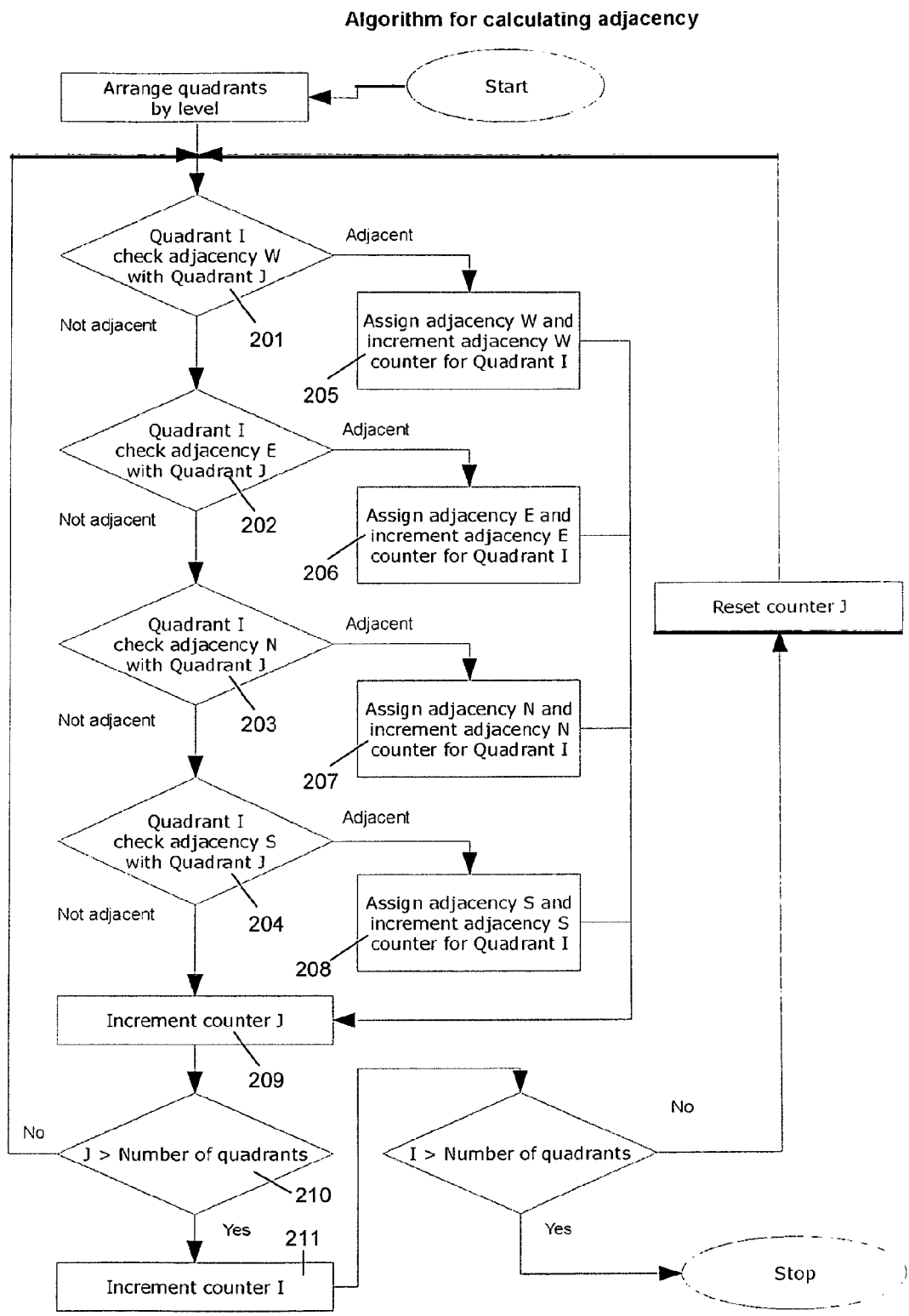
FIGS. 17, 18, 19 and 20 are simplified charts of algorithms used in the method according to the present invention.

In particular, FIG. 17 represents the algorithm Adjacency, which is capable to detect adjacency relationships between the various quadrants obtained by RQA algorithm (FIG. 1). In FIG. 17, each quadrant is referred with a number represented by "I" or "J" which univocally determines the quadrant (the wordings "quadrant I or J" stand respectively for "quadrant associated to the reference number I or J").

Each of processes 201-204 checks if there is any adjacency between quadrant I and quadrant J (in the sense that there is a border between quadrant I and quadrant J the pixels of quadrant I with the pixels of quadrant J), that is some pixel of quadrant I are directly adjacent to some pixels of quadrant J, without any interposition of further pixel of other colour.

In particular, process 201 checks if quadrant J is adjacent on the left side with respect to quadrant I. In this case, process 205 assigns an "adjacency W" (left adjacency) and increments an "adjacency W counter", which is a register that counts how many left adjacencies are present in the image.

On its own, process 202 checks if quadrant J is adjacent on the right side with respect to quadrant I. In this case, process 206 assigns an "adjacency E" (right adjacency) and increments an "adjacency E counter", which is a register that counts how many right adjacencies are present in the image.

Process 203 checks if quadrant J is adjacent upward with respect to quadrant I. In this case, process 207 assigns an "adjacency N" (upward adjacency) and increments an "adjacency N counter", which is a register that counts how many upward adjacencies are present in the image.

Process 204 checks if quadrant J is adjacent downward with respect to quadrant I. In this case, process 208 assigns an "adjacency S" (downward adjacency) and increments an "adjacency S counter", which is a register that counts how many downward adjacencies are present in the image.

Of course it is possible that quadrant J is not adjacent to quadrant I: in this case, each process 201-204 has negative output and then process 209 is started, said process 209 being also started after each of processes 205-208.

Process 209 increments J, such that, because of process 210, the processes 201-204 are activated again comparing the adjacency between the quadrant I and the new quadrant J. In this way, a cycle is realized so that all possible adjacencies of quadrant I with all the other quadrants are checked.

After that the adjacency of quadrant I is checked with respect to all the other possible quadrants, process 211 increments I, such that a new quadrant I is checked for adjacencies.

When I is more than the number of quadrants of the image, this means that all the possible adjacencies have been detected and the algorithm Adjacencies ends.

At the end of algorithm Adjacencies, a file reporting all left/right/upward/downward adjacencies is obtained.

Figure 18:
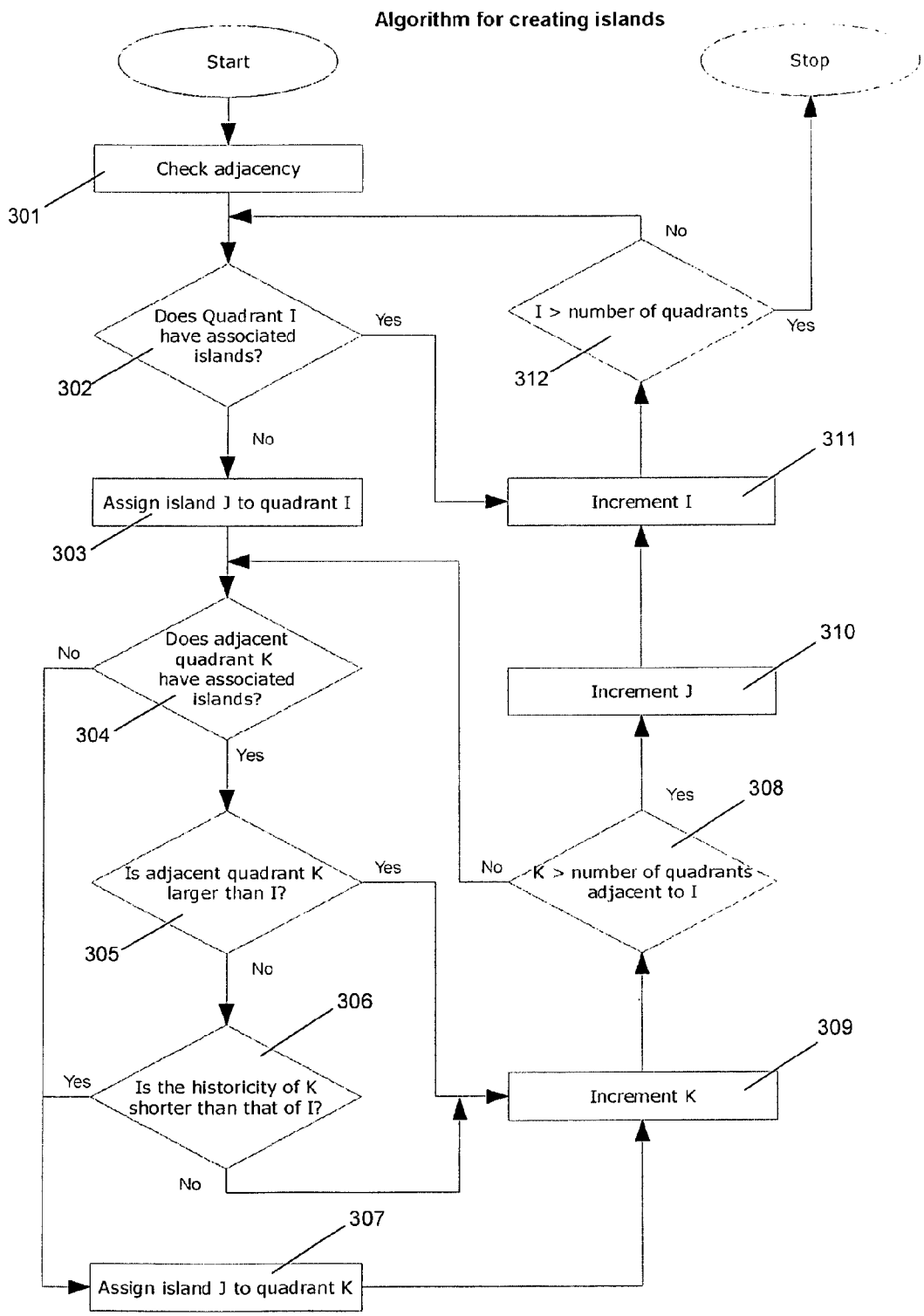

As stated above, FIG. 18 represents algorithm Islands, which uses, as input data, the output data generated by algorithm Adjacencies. Said algorithm Island is capable to map the image in a file of islands, each island being associated by its biggest quadrant (or, in case of more than one quadrant with the biggest dimension, the first quadrant detected between them).

The file of left/right/upward/downward adjacencies is loaded (process 301). At this point, for each quadrant (which is referenced to as quadrant I in the same way than in the algorithm Adjacencies) is checked:
  if quadrant I is associated to an island (process 302): in this case, no further analysis is carried out onto quadrant I, and the process 311 is directly activated, said process 311 incrementing I so that, after the check 312, a new quadrant is analyzed;
  if quadrant I is not associated to any island yet (process 302), then a new island J is associated to the quadrant I (process 303).

After process 303, all the quadrants adjacent to quadrant I are checked for controlling if due to previous iterations of the present algorithm, these adjacent quadrants are already associated to an island (process 304, said quadrants being numbered with K): if no one of the quadrants K is larger than quadrant I (process 305) and no one of said quadrants K has been analyzed before (process 306) then the island J is associated to quadrant K (process 307). The processes 308, 309 complete the cycle for controlling all the quadrants K adjacent to quadrant I.

When this cycle is ended, process 310 increments J, such that a new island is generated, and process 311 increments I, such that a following quadrant is examined.

After checking all the quadrants which are adjacent to quadrant I, processes 310, 311 increment I, J, respectively, such that a new island is searched for and a further quadrant is analyzed. Process 312 checks other quadrants are to be analyzed.

Algorithm Islands generates, thus, as output a file of islands mapping the image as a sequence of islands, each of said islands being univocally associated to its biggest quadrant (or one between the quadrants which have the biggest dimensions). Of course it is possible, in a variant of the present embodiment, to implement a digital filter so that island of very little dimensions is eliminated.

Figure 9A:
FIGS. 9A-9E are images relating to aspects of the method according to the invention.
Figure 9B:
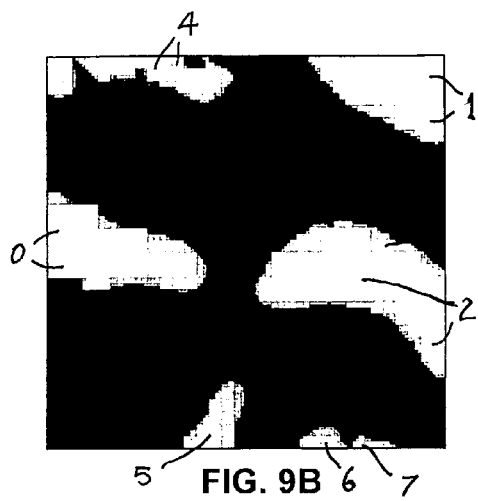
Figure 9C:
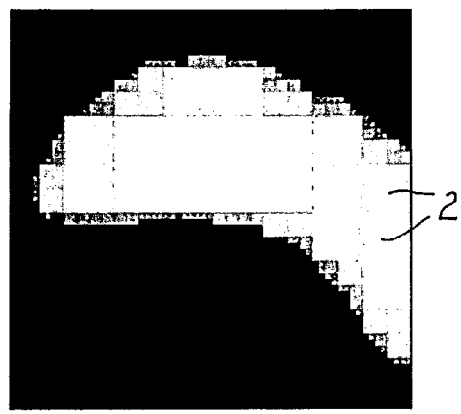

FIG. 9A shows a detail of a micro-radiographic image of a bone biopsy. FIG. 9B shows the identification of the clusters of quadrants coloured white and the numbering of the elementary quadrants comprising said clusters. FIG. 9C shows an enlargement of the island n. 2.

Figure 9D:
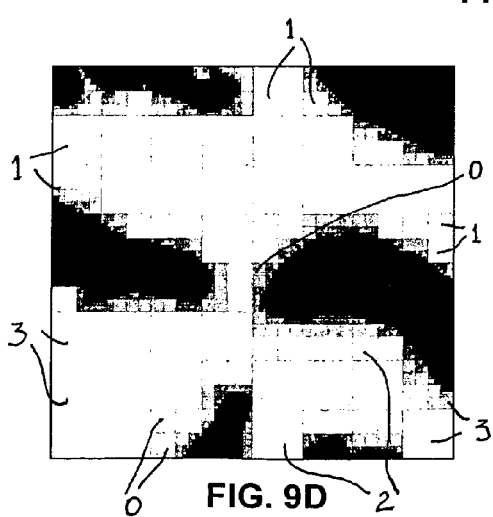
Figure 9E:
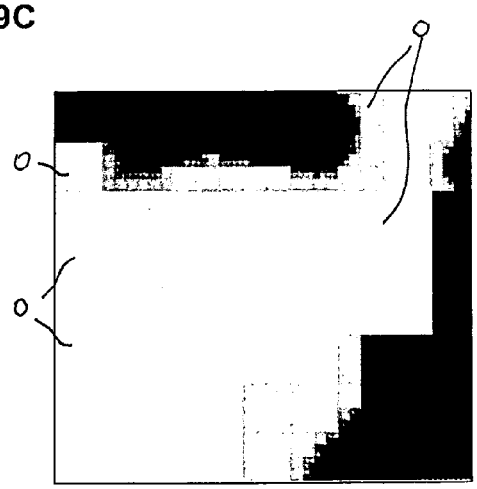

FIG. 9D shows the identification of the clusters of quadrants coloured black in FIG. 9A and the numbering of the elementary quadrants that comprise these clusters. FIG. 9E shows an enlargement of the island n. 0.

After identifying the islands comprising the image, the following steps are performed:
  the numbers of the quadrants constituting the single islands are counted and their dimensions are recorded;
  the values obtained at the previous step are averaged;
  the number and the probability of the adjacencies between the different quadrants and the different recursion levels in the single islands are calculated (this step uses the information obtained and saved by the previous adjacency calculation algorithm, such as the afore described adjacency counters);

the values obtained at the previous step are averaged.

It has to be noticed that the average values are, in this case, only mean values which are not related with the left, right, upward or downward adjacencies as calculated by processes 205-207 and 208. Thus, the average value calculated here takes in consideration the probability that, e.g., a quadrant of a first level M and a quadrant of a second level N are adjacent and not that the adjacency is a left, right, upward or downward adjacency.

The following table shows the calculation of the adjacencies of the islands coloured white in FIG. 8b.

| Calculation of adjacencies on the level | | | | | | | | | | |
|---|---|---|---|---|---|---|---|---|---|---|
| Size | 512 | 256 | 128 | 64 | 32 | 16 | 8 | 4 | 2 | 1 |
| Level: 0-512 pixel | 0 | 0 | 0 | 0 | 0 | 0 | 0 | 0 | 0 | 0 |
| Level: 1-256 pixel | 0 | 0 | 0 | 0 | 0 | 0 | 0 | 0 | 0 | 0 |
| Level: 2-128 pixel | 0 | 0 | 0 | 3 | 2 | 0 | 0 | 0 | 0 | 0 |
| Level: 3-64 pixel | 0 | 0 | 0 | 50 | 44 | 43 | 42 | 31 | 0 | 0 |
| Level: 4-32 pixel | 0 | 0 | 0 | 0 | 42 | 50 | 50 | 54 | 0 | 0 |
| Level: 5-16 pixel | 0 | 0 | 0 | 0 | 0 | 98 | 104 | 139 | 0 | 0 |
| Level: 6-8 pixel | 0 | 0 | 0 | 0 | 0 | 0 | 206 | 348 | 0 | 0 |
| Level: 7-4 pixel | 0 | 0 | 0 | 0 | 0 | 0 | 0 | 1300 | 0 | 0 |
| Level: 8-2 pixel | 0 | 0 | 0 | 0 | 0 | 0 | 0 | 0 | 0 | 0 |
| Level: 9-1 pixel | 0 | 0 | 0 | 0 | 0 | 0 | 0 | 0 | 0 | 0 |

| % Probability of adjacencies on the levels | | | | | | | | | | |
|---|---|---|---|---|---|---|---|---|---|---|
| Size | 512 | 256 | 128 | 64 | 32 | 16 | 8 | 4 | 2 | 1 |
| Level: 0-512 pixel | 0.0% | 0.0% | 0.0% | 0.0% | 0.0% | 0.0% | 0.0% | 0.0% | 0.0% | 0.0% |
| Level: 1-256 pixel | 0.0% | 0.0% | 0.0% | 0.0% | 0.0% | 0.0% | 0.0% | 0.0% | 0.0% | 0.0% |
| Level: 2-128 pixel | 0.0% | 0.0% | 0.0% | 37.5% | 12.5% | 0.0% | 0.0% | 0.0% | 0.0% | 0.0% |
| Level: 3-64 pixel | 0.0% | 0.0% | 0.0% | 50.0% | 22.0% | 10.8% | 5.3% | 1.9% | 0.0% | 0.0% |
| Level: 4-32 pixel | 0.0% | 0.0% | 0.0% | 0.0% | 30.0% | 17.9% | 8.9% | 4.8% | 0.0% | 0.0% |
| Level: 5-16 pixel | 0.0% | 0.0% | 0.0% | 0.0% | 0.0% | 34.5% | 18.3% | 12.2% | 0.0% | 0.0% |
| Level: 6-8 pixel | 0.0% | 0.0% | 0.0% | 0.0% | 0.0% | 0.0% | 33.4% | 28.2% | 0.0% | 0.0% |
| Level: 7-4 pixel | 0.0% | 0.0% | 0.0% | 0.0% | 0.0% | 0.0% | 0.0% | 52.4% | 0.0% | 0.0% |
| Level: 8-2 pixel | 0.0% | 0.0% | 0.0% | 0.0% | 0.0% | 0.0% | 0.0% | 0.0% | 0.0% | 0.0% |
| Level: 9-1 pixel | 0.0% | 0.0% | 0.0% | 0.0% | 0.0% | 0.0% | 0.0% | 0.0% | 0.0% | 0.0% |

Figure 10A:
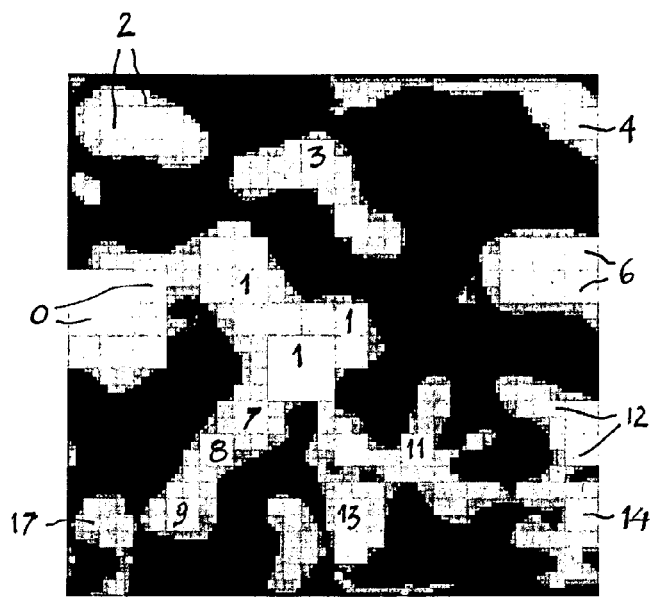
FIG. 10A shows the breakdown into quadrants relating to the colour white of an enlarged image of human maxilla bone tissue according to the method of the invention.
Figure 10B:
FIGS. 10B-10C show artificial fractal islands relating to the breakdown of the colour white in FIG. 10A according to the method of the invention.
Figure 10C:
Figure 11A:
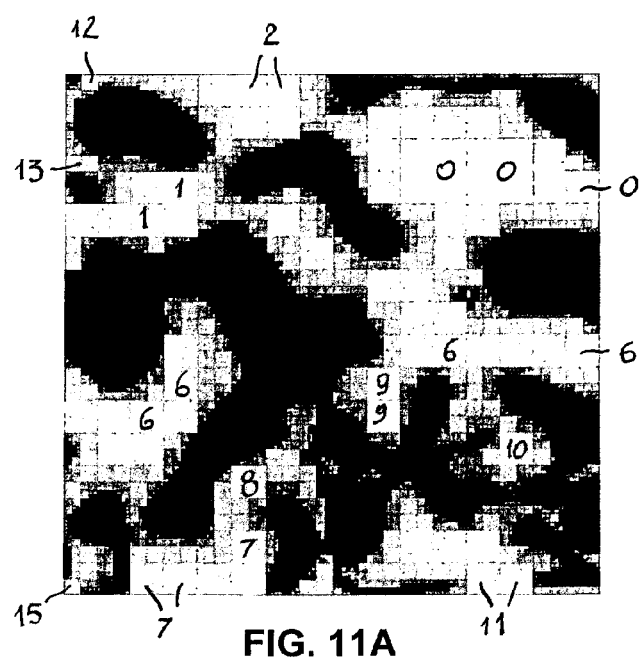
FIG. 11A shows the breakdown into quadrants relating to the colour black of an enlarged image of human maxilla bone tissue according to the method of the invention.
Figure 11B:
FIGS. 11B-11D show artificial fractal islands relating to the breakdown of the colour black in FIG. 11A according to the method of the invention.
Figure 11C:
Figure 11D:

Stage 1) relates to the generation of artificial clusters of quadrants, or fractal elements, having geometrical characteristics that reproduce or approximate the characteristics of the clusters of adjacent fractal elements established at stage i). The data obtained by the Islands algorithm are used to generate artificial fractal islands lying on the horizontal axis X on a probabilistic basis. The artificial islands are generated by positioning on the X axis first the larger-sized quadrants and then the smaller-sized quadrants, complying with the number of quadrants and the probability of adjacency derived from the mean of the number of quadrants and of the adjacencies of the islands the constitute the original image and that have been chosen. The islands thus generated have geometrical characteristics compatible with the islands on the original source image, in terms of both their proportions and the number of quadrants and adjacencies between them. The artificial fractal islands are generated by the computer using a suitable Quadrant Fall (QF) algorithm, illustrated in FIG. 19. FIGS. 10A, 10B and 10C respectively show the breakdown of a micro-radiographic image of a bone biopsy from a human jaw into quadrants (10A) and two artificial fractal islands (10B and 10C) obtained from data relating to the white-coloured parts of the image 10A.

FIGS. 11A, 11B, 11C and 11D respectively show the breakdown of the same micro-radiographic image of a human jaw bone biopsy into quadrants as in FIG. 10A and three artificial fractal islands (11B, 11C and 11D) obtained from data relating to the black-coloured parts of the image 10A.

Figure 19:
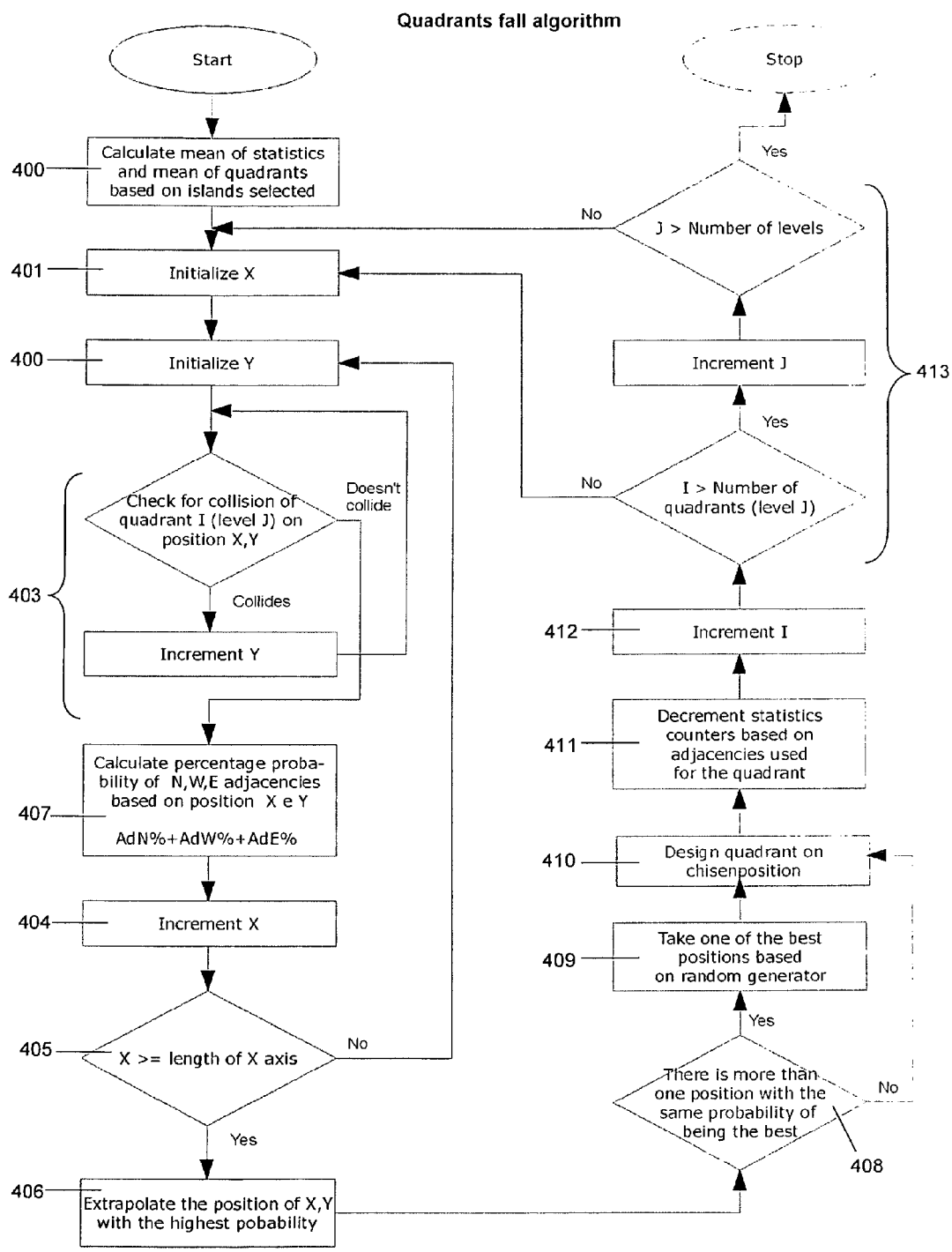
Figure 33:
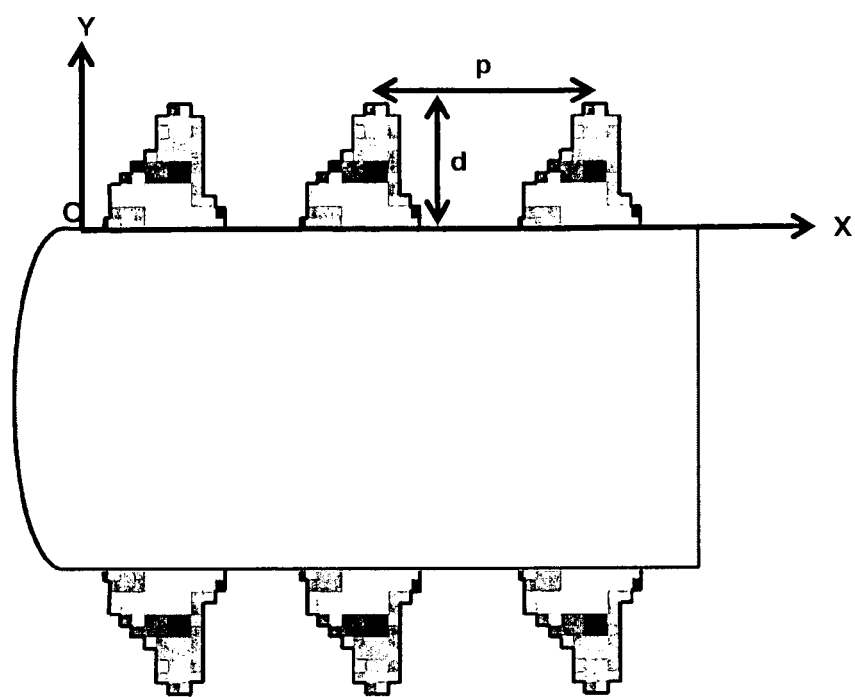
FIG. 33 shows the lower extremity of a dental implant obtained according to the method of the invention.

Concerning algorithm QF, shown in FIG. 19, said algorithm QF uses the data outputted by algorithm Island. For this aim, a quadrant store is created, wherein said quadrant store comprises a plurality of artificial quadrants which are characterized by quantity, size and reciprocal adjacencies as in the average quadrants of the selected islands. Instead, the artificial quadrants of the quadrant store have not a fixed position yet, said position being intended to be found by algorithm QF itself. Artificial quadrants of the quadrant store are sorted from the biggest artificial quadrant to the smallest artificial quadrant (J is the level of the quadrant, I is referred to the specific quadrant). In algorithm QF coordinates X and Y are taken in account, which are illustrated in FIG. 33 and are respectively parallel to the axis of the implant and parallel to the height of the thread of the implant.

The quadrant store is created by process 400. The initialisation processes are referred to with 401, 402.

Figure 34:
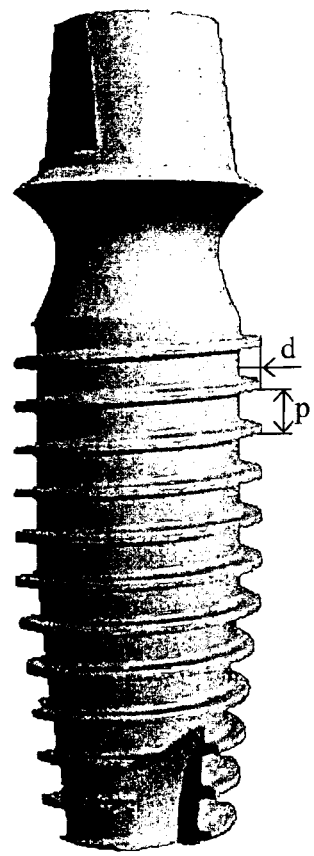
FIGS. 34-36 show dental implants obtained according to the method of the invention.

At this point, quadrant I is checked for a collision on position X, Y (it has to be noticed that processes 401, 402 initialize the coordinates X, Y so that the first point to be checked is O of FIG. 34, which is the lowest possible point and the nearest one to the axis of the implant to be made).

Cycle 403 is started for checking collisions between the artificial quadrant I and possible previously placed artificial quadrants in the position X, Y, wherein the collision means the superposition of at least one pixel of artificial quadrant I with a previously placed artificial quadrant. Cycle 403 checks:

if artificial quadrant I collides with a previously placed artificial quadrant (placed previously by the algorithm) then a new position Y is tried by incrementing Y, without changing X;

if artificial quadrant I does not collides with any other previously placed quadrants, then cycle 403 is ended and process 407 starts.

Process 407 calculates the adjacency probability between quadrant I and previously placed quadrants in position X, Y.

Process 404 increments X, and process 405 starts process 402. Thus, at this point, a new position X, Y is checked, wherein Y=O.

When all the positions have been checked, process 406 extrapolates the position of X, Y with the highest probability among the positions already examined by 403, 407: for each possible position where artificial quadrant I could be placed, the position with highest probability is chosen by process 406 on the basis of the data collected by repeating process 407.

If there is more than one position with the same probability of being the best position (check 408) then a random choice among said more than one position is made by process 409. Process 410 designs artificial quadrant I on the position extrapolated by process 406 or 409. At this point, artificial quadrant I is placed on position X, Y. Process 411 updates the statistic counters based on adjacencies of artificial quadrant I. Process 412 increments I so as to search a position for a further artificial quadrant. Processes 413 are so that all artificial quadrants of all levels are taken in consideration.

The output of algorithm QF is a fractal artificial island constituted of an adjacency-work of quadrants. Anyway, as random variables have been implied, it is possible that better artificial implants are possible. Thus, algorithm QF is repeated a considerable high number of times (e.g. 100 times) so that 100 different results are generated. For each result a consistency value is obtained from the formula wherein SUM (J) is the sum of the adjacencies of the fractal artificial island obtained by QF, and SUM (K) is the sum of the adjacencies of the selected islands. A greater C (%) implies a better $$C(\%) = 100 - 100 \frac{SUM(J)}{SUM(K)}$$

consistency.

Stage m) involves designing the implant device as a function of the characteristics of the recipient tissue established from the previous stages, and particularly at stage h), when the tissue is classified, and at stage 1), when the artificial fractal clusters are generated. In fact, the artificial islands obtained from the analysis of the colours white and black are used to design the implant in relation to the macro- and micro-geometry of each quality class of the tissue.

Figure 12A:
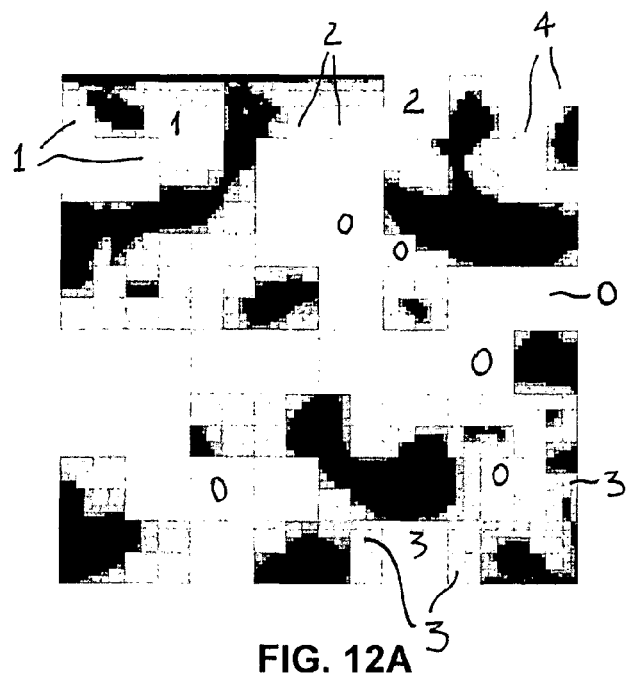
FIGS. 12A-12B show a first dental implant obtained according to the method of the invention.
Figure 12B:
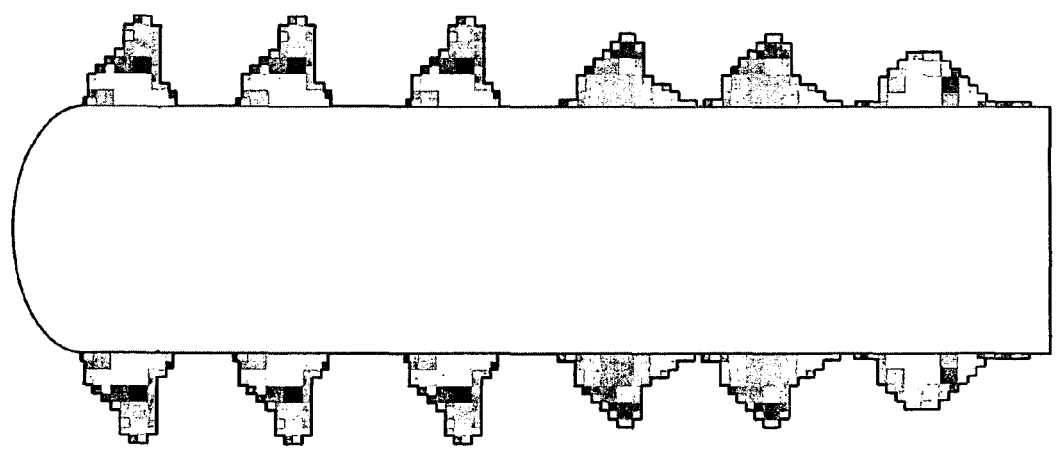
Figure 13A:
FIGS. 13A-13B show a second dental implant obtained according to the method of the invention.

FIGS. 12, 13 and 14 show examples of how artificial islands relating to bone tissue are used in the design of the thread on a dental implant. They can also be used to design all the other parts, i.e. the body, tip and neck of the implant. More in particular:

FIG. 12B is an example of an implant with a thread suitable for a bone of good density, shown in FIG. 12A.

Figure 13B:
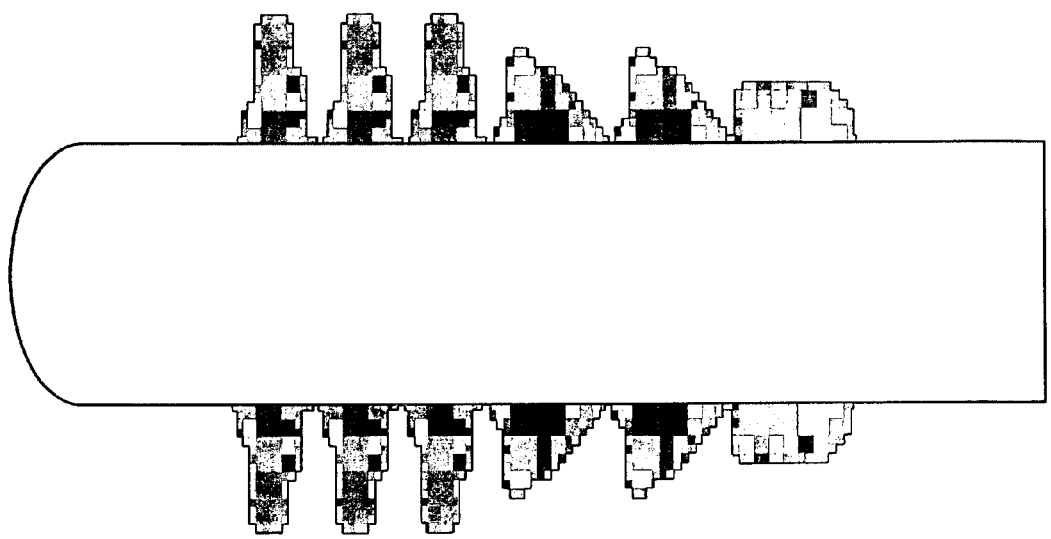

FIG. 13B is an example of an implant with a thread suitable for a bone of moderate density, shown in FIG. 13 A.

Figure 14A:
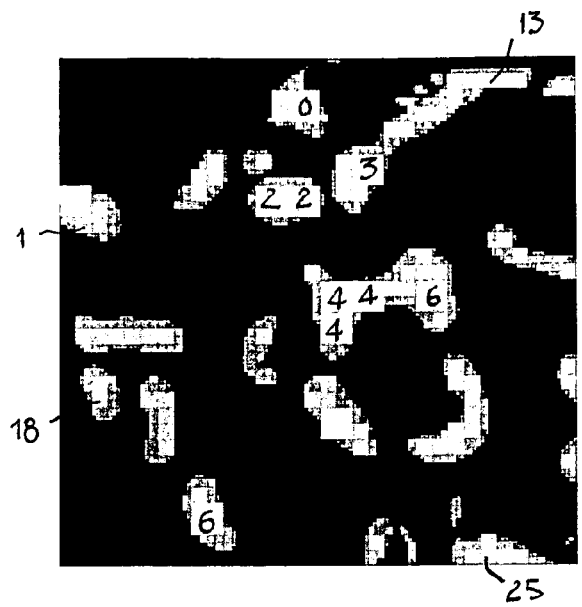
FIGS. 14A-14B show a third dental implant obtained according to the method of the invention.
Figure 14B:
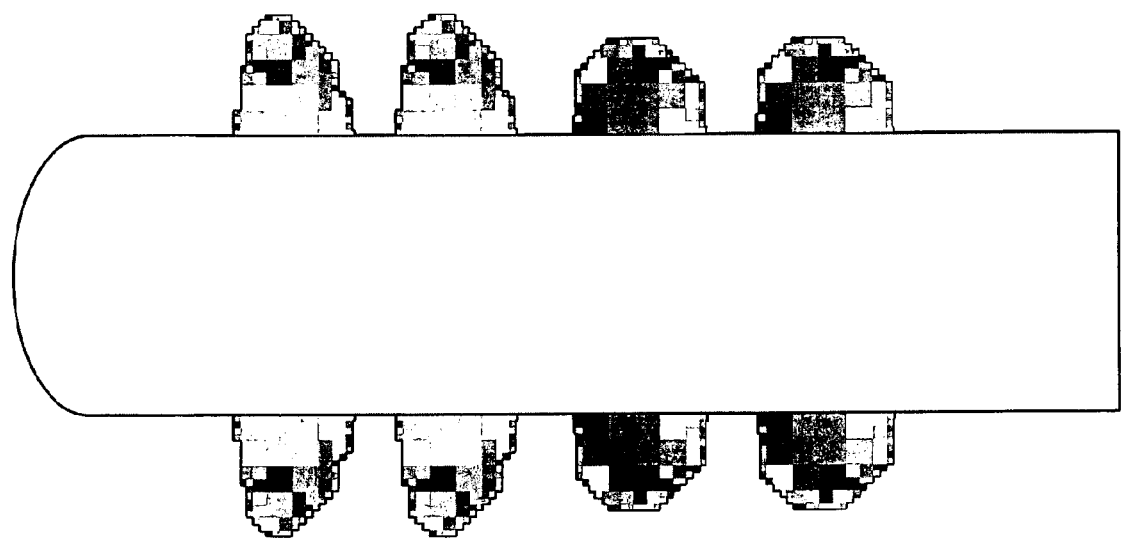

FIG. 14B is an example of an implant with a thread suitable for a bone of poor density, shown in FIG. 14A.

FIGS. 12B, 13B and 14B show the dental implants schematically comprising the same cylindrical body (for instance) but with different types of screw thread around said cylindrical body. The types of thread differ, for instance, in terms of the pitch and the shape of the thread, and also in that different parts of the same implant body may have different types of screw thread. Each implant is thus designed with the screw and/or stretches of the screw specifically adapted to the structure of the bone destined to receive the implant. In particular, the shape of the screw is chosen on the strength of the artificial fractal islands obtained with the QF algorithm so as to achieve an optimal filling of the intra-trabecular spaces and an excellent osteointegration. The classification of the bone in n predefined classes is useful for the macro-design of the implant and is associated with the use of the artificial fractal islands for the micro-design and detailed definition of the implant, which can thus be tailored to the morphological features of the bone concerned.

According to another aspect of the invention, the same previously-described method is used to design a biomaterial with a morphological structure similar to that of the tissue in which it is to be implanted. Here again, artificial clusters are generated with geometrical characteristics that reproduce or approximate the characteristics of the clusters of adjacent fractal elements described in stage i). The data obtained by means of the Islands algorithm are used to generate artificial fractal islands on a probabilistic basis. These artificial islands are generated in the middle of the screen, by positioning first the larger-sized quadrants and then the quadrants of smaller dimensions, following the number of quadrants and the probabilities of adjacency of the islands that constitute the original image and that were chosen. The islands thus generated have geometrical characteristics compatible with the islands on the original source image, in terms of both their proportions and the number of quadrants and the adjacencies between them. The artificial fractal islands for the biomaterial are generated by the computer using a suitable Perimetral Ordered Displacement (POD) algorithm, schematically illustrated in FIG. 20.

Figure 20:
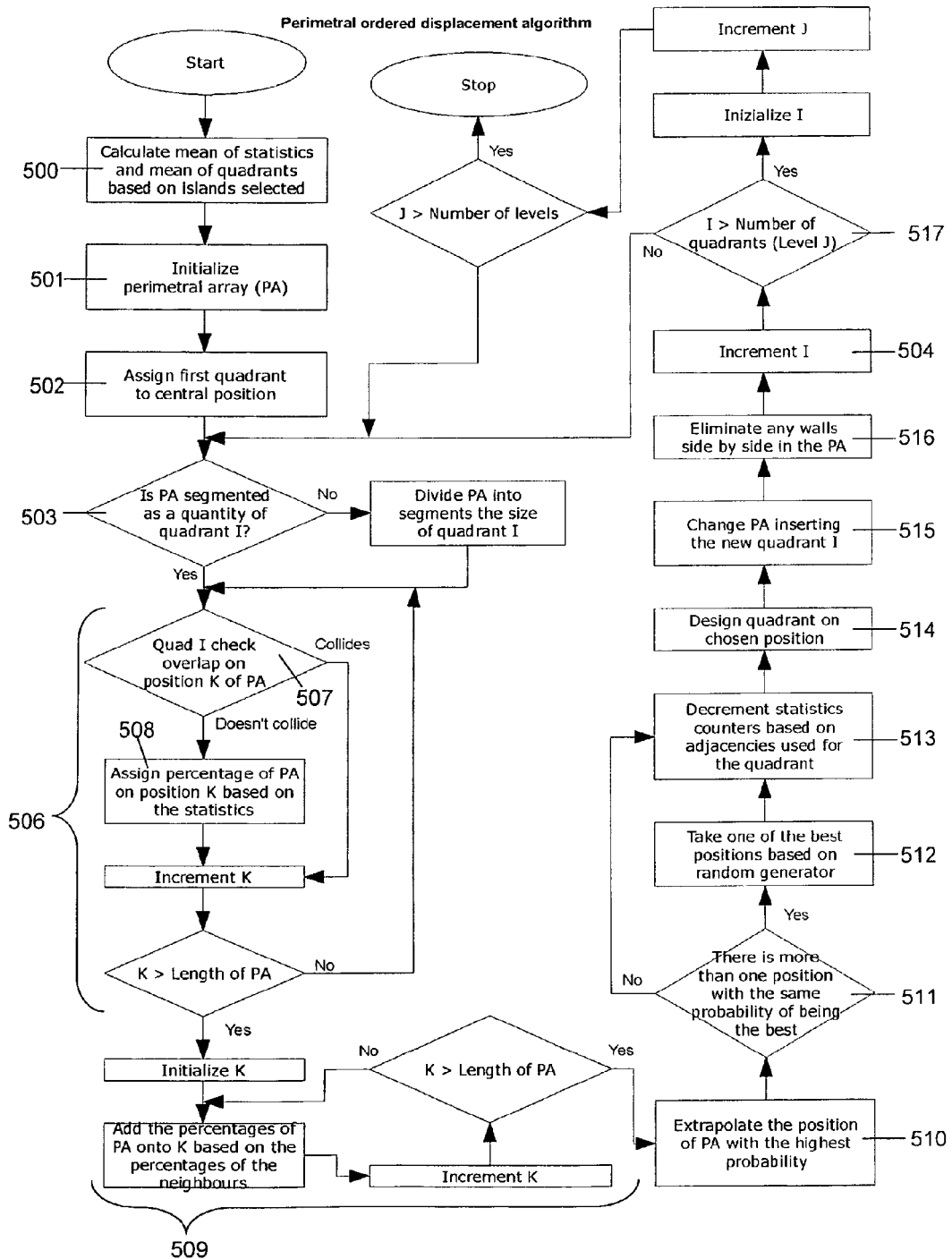

Concerning algorithm POD, shown in FIG. 20, said algorithm POD uses the data outputted by algorithm Island, like algorithm QF. For this aim, a quadrant store is created, wherein a plurality of artificial quadrants is comprised, each artificial quadrant being characterized by quantity, size and reciprocal adjacencies as in the average quadrants of the selected islands.

Instead, the artificial quadrants of the quadrant store have not a fixed position yet, said position being intended to be found by algorithm POD. Artificial quadrants of the quadrant store are sorted from the biggest artificial quadrant to the smallest artificial quadrant (J is the level of the quadrant, I is referred to the specific quadrant). Algorithm POD takes in account a perimetral array PA, which is an array that contains quadrants constituting the perimeter of the artificial island created by the algorithm POD itself. By means of said perimetral array PA, the perimeter of the artificial island created by algorithm POD is "segmented" with quadrants of different size: perimetral array PA, which is dynamically modified by algorithm POD, maps a plurality of positions wherein further artificial quadrants are placeable by algorithm POD.

As illustrated by FIG. 20, said algorithm POD uses the data outputted by algorithm Island (process 500).

The quadrant store is created by process 500. The perimetral array PA is initialized at process 501.

Process 502 assigns the first quadrant to central position.

Process 503 checks if perimetral array PA is segmented in such a way that said perimetral array PA can contain artificial quadrant I (wherein quadrants are referenced to by I). If perimetral array PA cannot contain artificial quadrant I, then perimetral array PA is re-divided into segments compatible with the artificial quadrant I.

Loop 506 scans the perimetral array PA with respect to artificial quadrant I. In particular, if artificial quadrant I overlaps, on a position K, with a segment of perimetral array PA (process 507), then process 508 assigns a percentage of PA based on the statistics Loop 509 is meant for verifying the probabilities of adjacency with neighbouring quadrants of the fractal artificial island.

Thanks to loops 506, 509, each analyzed position is assigned with a score on the bases of the adjacencies with neighbouring quadrants (considering left, right, upward and downward adjacencies). The higher the score, the better probability of being the most appropriate position for the artificial quadrant I.

Process 510 assigns the position with highest score. If more than one position has the same better score (check 511), then process 512 chooses the position for artificial quadrant I in a random fashion between said more than one position.

Process 513 decrements the statistic counters based on the adjacencies used for artificial quadrant I at the position obtained by process 510 or 512. Process 514 designs quadrant I in the position obtained by process 510 or 512. Process 515 changes perimetral array PA on the basis on the established position of artificial quadrant I, which is now part of perimetral array PA.

Because of the presence of artificial quadrant I in the perimetral array PA, it is possible that there are "walls" between two segments of the perimetral array PA. This is not acceptable because perimetral array PA is meant to be referred only to a border line, thus only a part of the new quadrant has to be maintained. Process 516 is meant at eliminating said walls from perimetral array PA, thus "cleaning" the perimetral array PA from pixels which are not effectively on the border.

Process 504 increments I, so that a new artificial quadrant I is examined for having a position.

At the end of the algorithm POD, a fractal artificial island is created, said artificial island being perimetrally delimited by the perimetral array PA.

It is possible to run a series of algorithms POD, and calculate the consistency C (%) of each of the results, such that the better artificial fractal island is chosen by means of C (%).

FIGS. 21-32 schematically show examples of biomaterials designed using the artificial islands generated by the POD algorithm. The islands represent the basic modules for the design of the particles of biomaterials. The examples relate to particles of diverse structure designed to resemble the structure of the tissue, and particular of bone tissue, into which the particle of biomaterial is to be inserted. The examples relate to bone tissues of various densities, e.g. good, moderate and poor density.

Figure 21:
FIGS. 21, 25 and 29 are images of different human maxillary and mandibular bone tissues.
Figure 25:
Figure 29:
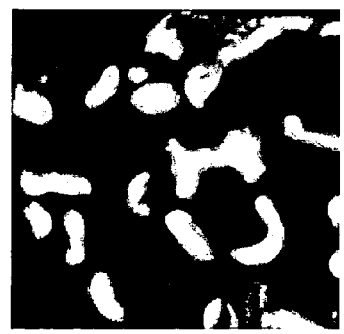

FIGS. 21, 25, 29 are images of different human maxillary and mandibular bone tissues, respectively of good, moderate and poor density.

FIGS. 22, 26, 30 are images derived from the breakdown of the images in FIGS. 21, 25, 29.

Figure 22A:
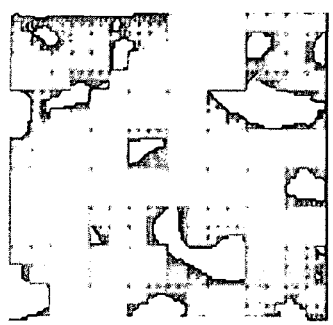
FIGS. 22A-22D, 26A-26D and 30A-30D are images respectively derived from the breakdown of the images in FIGS. 21, 25, 29.
Figure 22B:
Figure 22D:
Figure 22C:
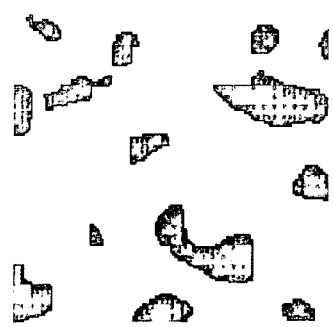
Figure 23:
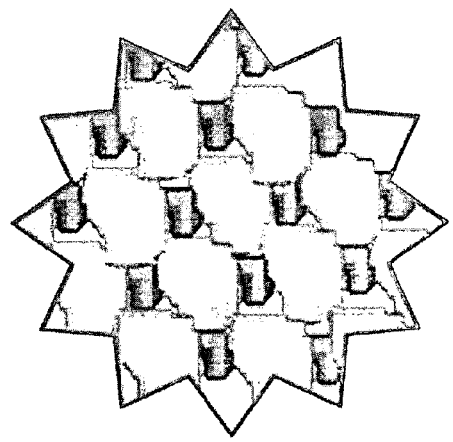
FIGS. 23, 27 and 31 show particles of biomaterial obtained with the method according to the invention.
Figure 24:
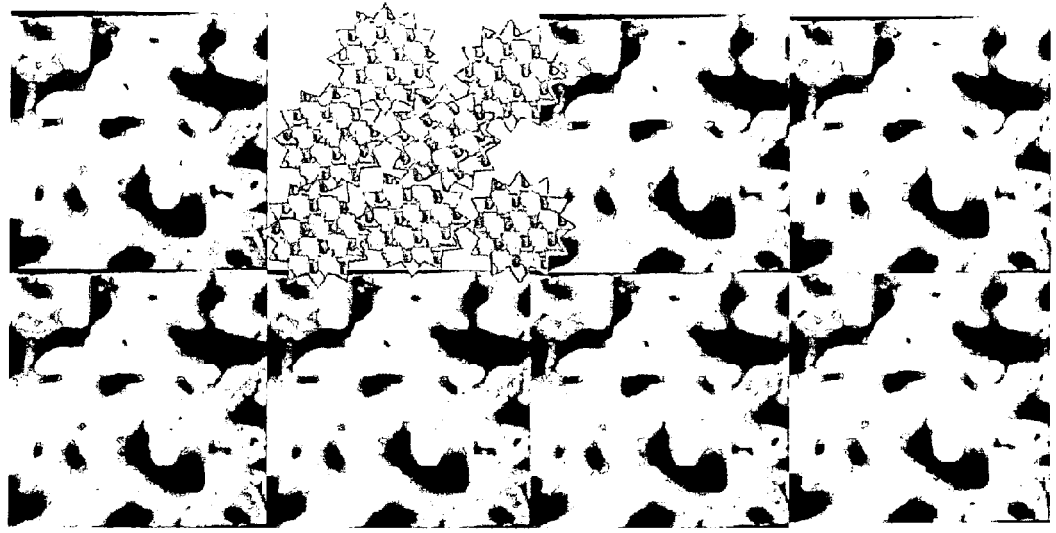
FIGS. 24, 28 and 32 show the particles in FIGS. 23, 27 and 31 implanted in biological tissues
Figure 26A:
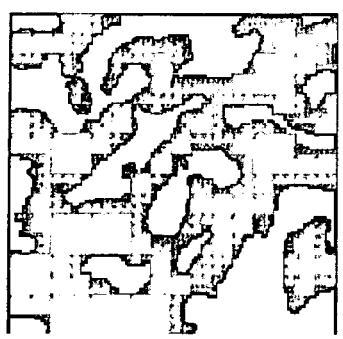
Figure 26B:
Figure 26C:
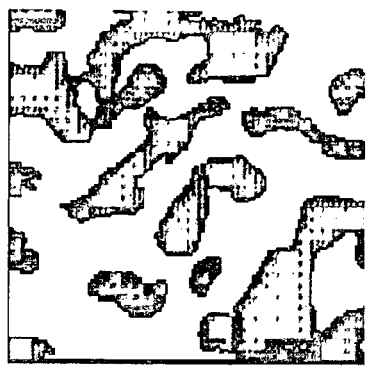
Figure 26D:
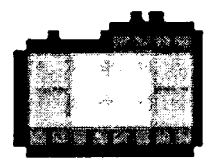
Figure 27:
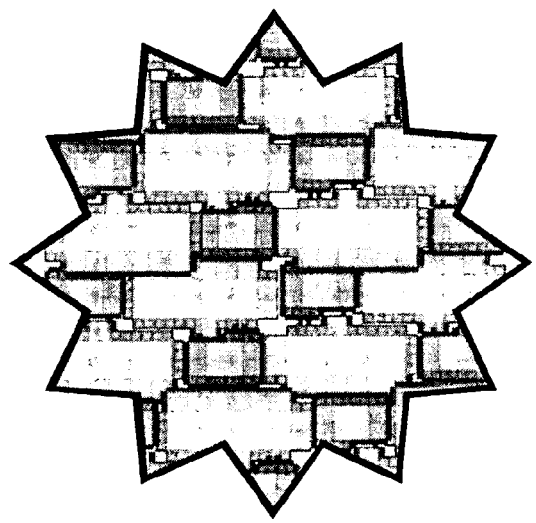
Figure 28:
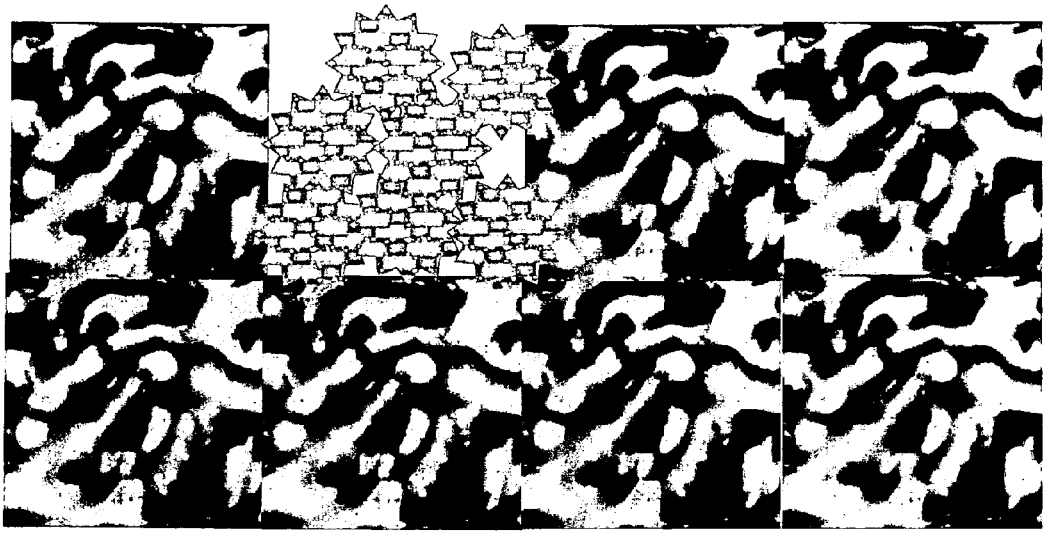

FIGS. 22A, 22B respectively show the breakdown into quadrants relating to the colour white of the image in FIG. 21, and the corresponding artificial fractal island. FIGS. 22C, 22D respectively show the breakdown into quadrants relating to the colour black of the image in FIG. 21, and the corresponding artificial fractal island. FIG. 23 shows an example of a particle of biomaterial with characteristics of external shape and internal structure resembling the original good-density bone, in which the "starry" surface shaping is shown merely as an example. FIG. 24 shows the filling of an area of bone loss to regenerate with good-density particles designed with the method according to the invention. The particle of biomaterial has a morphological structure resembling that of the bone tissue in which it is implanted. FIGS. 26A, 26B respectively show the breakdown into quadrants relating to the colour white of the image in FIG. 25, and the corresponding artificial fractal island. FIGS. 26C, 26D respectively show the breakdown into quadrants relating to the colour black of the image in FIG. 25, and the corresponding artificial fractal island. FIG. 27 shows an example of a particle of biomaterial with characteristics of external shape and internal structure resembling the original moderate-density bone, in which the "starry" surface shaping is shown merely as an example. FIG. 28 shows the filling of an area of bone loss to regenerate with moderate-density particles designed with the method according to the invention. The particle of biomaterial has a structure morphologically resembling that of the bone tissue in which it is implanted.

Figure 30A:
Figure 30B:
Figure 30C:
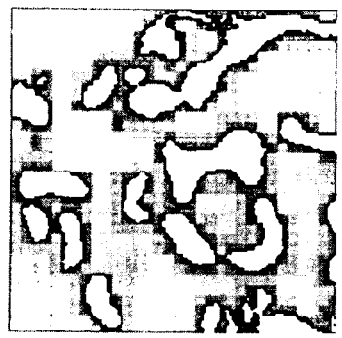
Figure 30D:
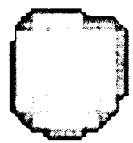
Figure 31:
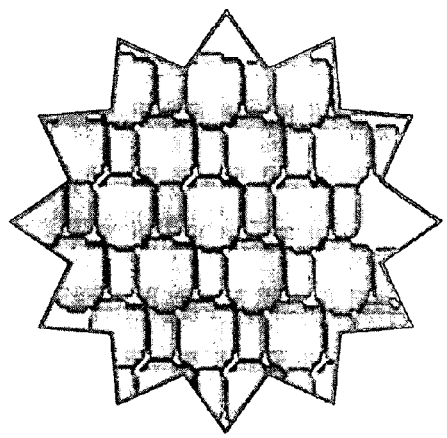
Figure 32:
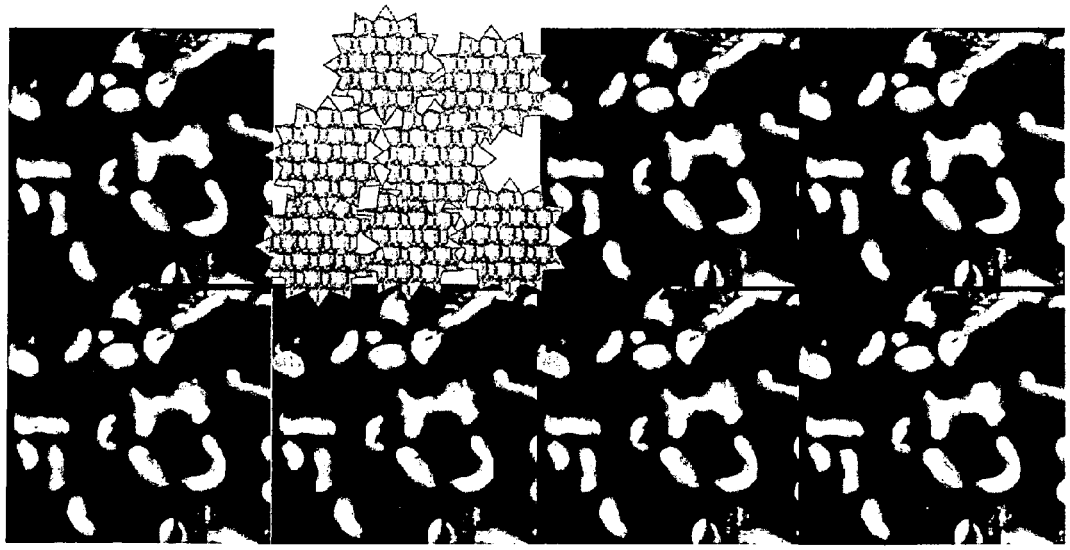

FIGS. 30A, 30B respectively show the breakdown into quadrants relating to the colour white of the image in FIG. 29, and the corresponding artificial fractal island. FIGS. 30C, 30D respectively show the breakdown into quadrants relating to the colour black in the image in FIG. 29, and the corresponding fractal artificial island. FIG. 31 shows an example of a particle of biomaterial with characteristics of external shape and internal structure resembling the original poor-density bone, in which the "starry" surface shaping is shown merely as an example. FIG. 32 shows the filling of an area of bone loss to regenerate with poor-density particles designed with the method according to the invention. The particle of biomaterial has a morphological structure resembling that of the bone tissue in which it is implanted.

The particles of biomaterial shown in FIGS. 23, 27 and 31 can be joined to form blocks of clusters of variable dimensions to suit clinical needs, which are implanted and stabilised, e.g. by means of fixing screws, in the area of bone loss to regenerate. The blocks that can be produced in this way will have an internal structure similar to that of the bone to regenerate.

The above are descriptions of some preferred embodiments of the invention, provided here as a non-limiting example, on the understanding that the invention may undergo numerous modifications and variants coming within the scope of the attached claims.

In particular, the method of the invention can be used to design the structure and the surface of other implantable devices or for inserting in contact with biological tissues, such as membranes, stents, biomaterials and the like, designed according to the method described herein with a view to achieving an optimal coupling for the purposes of the integration and stability of the device within the tissue.

Figure 15:
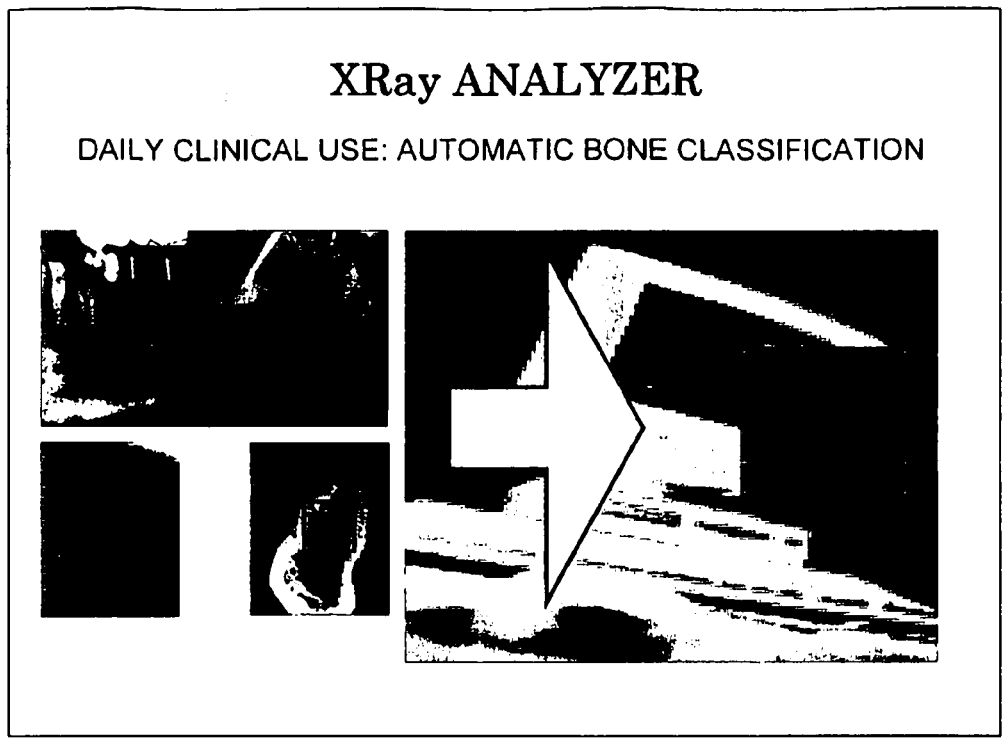
FIGS. 15 and 16 show the images displayed on a computer screen equipped with software for automatically implementing the method according to the invention.
Figure 16:
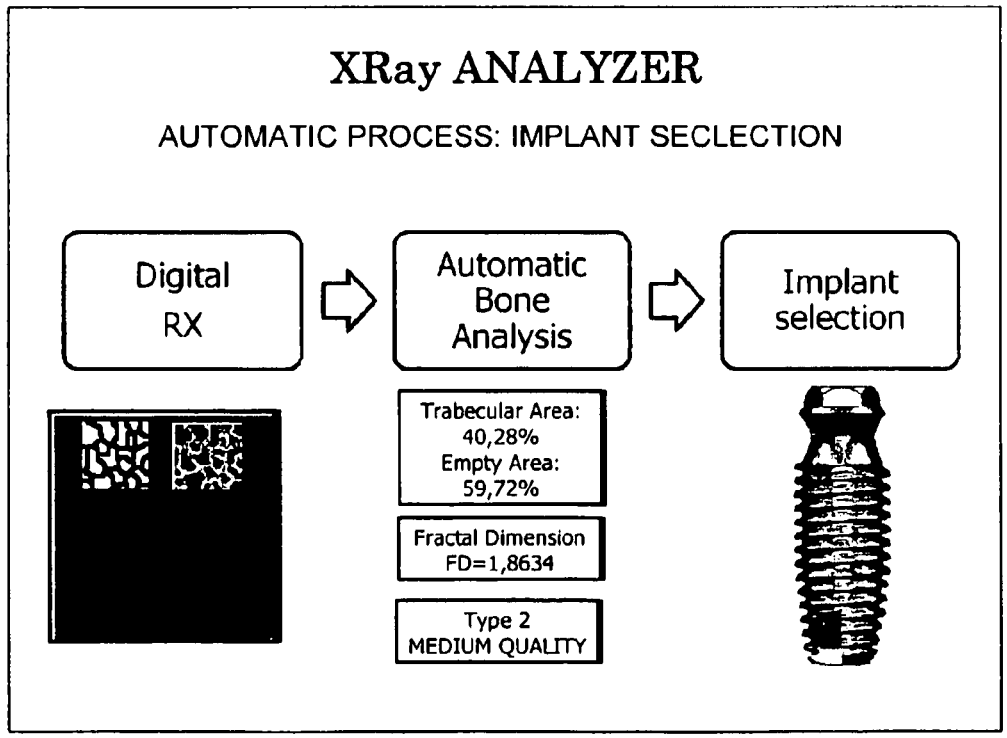

Another aspect of the invention concerns a simplified procedure that provides the clinician with a software-hardware apparatus consisting of: a personal computer (or dedicated hardware card), a scanner (or other means for digitizing images), and a suitable dedicated program. Using the method of the invention, the clinician inputs the image to digitise in the scanner or loads the already-digitized image of the tissue to analyse directly in the computer and the program automatically identifies and classifies the tissue, providing information relating to the device and/or material most suitable for implanting in the type of tissue concerned. FIGS. 15 and 16 show an example of this simplified procedure, which refers to the analysis of the digital radiographs in daily odontoiatric use. The clinician selects the area of interest, as shown in FIG.

15, then the software analyses and classifies the tissue, automatically providing recommendations on the type of dental implant to use, as shown in FIG. 16. Such an embodiment is such that implants are pre-formed (e.g. three pre-formed implants of FIGS. 34-36), is illustrated by FIGS. 37A-37B.

In fact, a great number of digital image of different sample bones from different people are acquired, among them digital images 600, 610. By means of the above described fractal analysis (e.g. algorithm RQA), schematized here with 603, each sample is mapped into a couple of fractal images 601, related with black islands, and 602, related with white islands.

A classification into 3 classes (in other embodiments the classes could be in different number) as a function of said percentage of areas of tissue with the greatest density of matter, of said percentage of areas of tissue with the least or no density of matter, and of the percentage distribution of the quadrants of different dimensions obtained is carried out. An average value is thus obtained.

By means of a QF analysis on the mean values obtained, as schematized here with 605, the features of the implants to be chosen (pitch p and depth d of the thread of the implants) are realized by industrial means.

In order to present an example, the following dimensions for the implants have been chosen for different bone classes, wherein the pitch p and the depth d of the thread of the implants are in mm.

Then, the realized pre-formed implants are placed in the market and sold as basic components for

Figure 35:
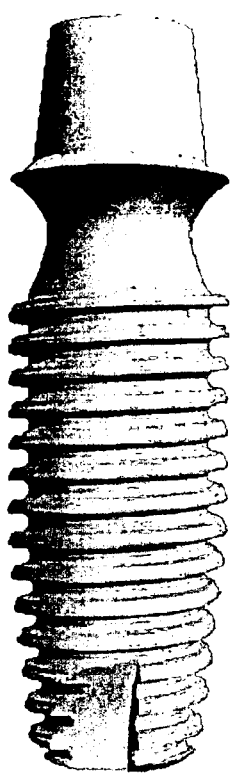
Figure 36:
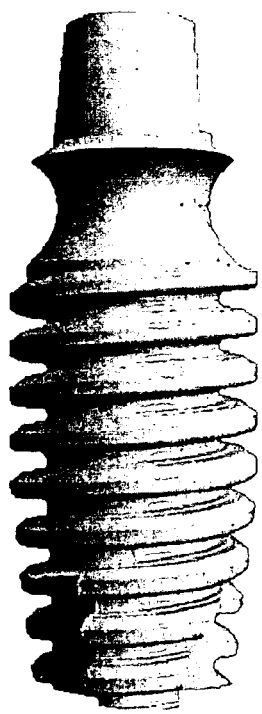
Figure 37A:
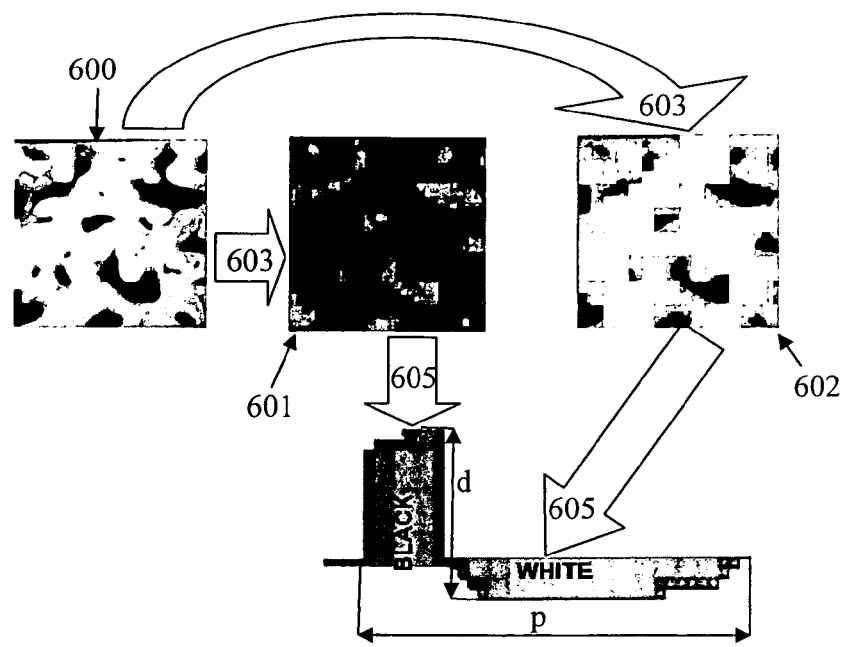
FIGS. 37A and 37B show conceptually a part an embodiment of the present invention.
Figure 37B:
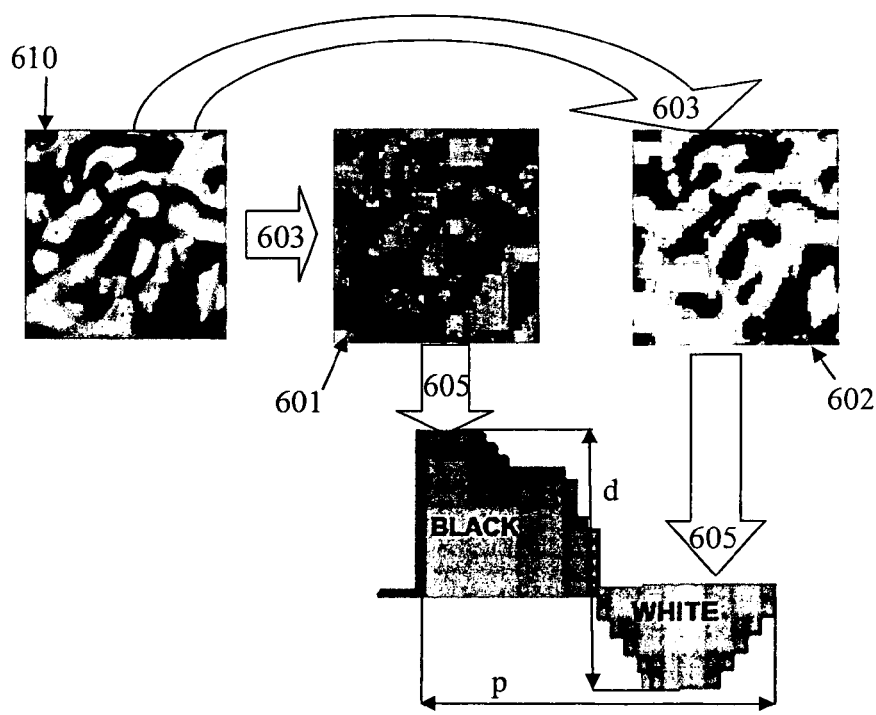

| BONE CLASS | PITCH P | DEPTH D | IMPLANT |
|---|---|---|---|
| high bone density | 0.720 | 0.360 | FIG. 34 |
| medium bone density | 0.600 | 0.400 | FIG. 35 |
| low bone density | 0.960 | 0.720 | FIG. 36 | dental implants. When the clinician intends to choose one of these three implants, he needs to analyze the bone density that is intended to host the implant (FIGS. 15, 16). An image of the structure of the human tissue destined to receive a device and/or material is to be made. Then, said image needs to be converted in digital format. Then, a new fractal analysis for the acquired image is to be carried out. Algorithm RQA helps to define which class of implant needs to be implanted in the said human tissue. In principle, as described by method according to claim 14, the implants are chosen among the ones at disposal of the clinician. In this way, it is possible to obtain an implant whose average features (in particular pitch p and depth d of the thread) are as much as possible similar to the human tissue which receives the implant.

Figure 38:
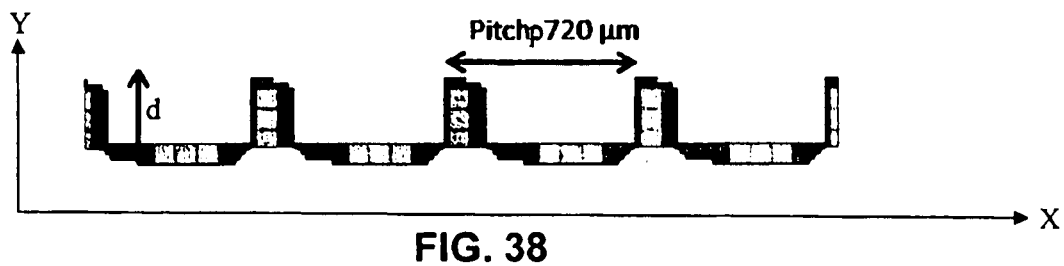
FIG. 38 shows a diagram related with a part of an implant generated by the method part of FIGS. 37A and 37B.
Figure 39:
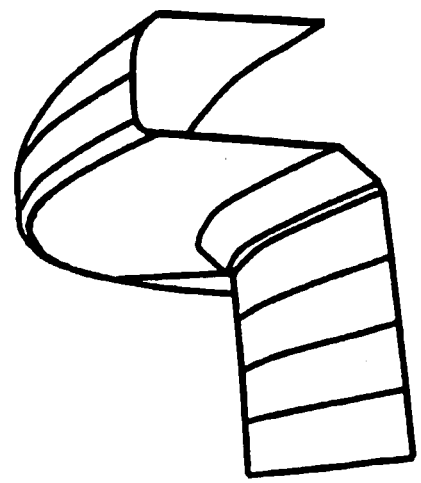
FIG. 39 shows a partial view of a three dimensional drawing of the thread of FIG. 38. The method according to the invention enables the design of devices and/or materials for implanting in tissues of the human or animal body and capable of becoming effectively integrated and/or implanted in the recipient tissue. The words "effective integration and/or implantation" are used to mean that the device reduces the post-implantation healing time and maximises the long-term performance of the device.

FIG. 38 shows a thread of an implant chosen by the method part of FIG. 37. FIG. 39 shows a partial view of a three dimensional drawing of the thread of FIG. 38.

The invention claimed is:

1. A method for designing a device and/or material for inserting or implanting in tissues of a human or animal body characterized in that it comprises the following stages:
   a) acquisition of a digital image of a structure of a tissue destined to receive a device or implant, said digital image identifying areas of tissue with different densities of matter;
   b) calibration of a colour level of said areas of tissue with different densities of matter, comprising an assignment of a first colour level to the areas of tissue with greatest density of matter (dmax) and a second colour level to the areas of tissue with least or no density of matter (dmin), values of said greatest density of matter (dmax) and said least or no density of matter (dmin) being referred to type and location of said tissue;
   c) calculation of the colour level of said image comprising the assignment of said first colour level if the image contains at least 60% of said first colour, or the assignment of said second colour level if the image contains no more than 40% of said first colour; or division of said image into four quadrants if the image contains between 60% and 40% of said first colour level;
   d) the calculation, where said image is divided into four quadrants, of the colour level of each of said four quadrants obtained at the previous stage c), comprising the assignment of said first colour level or of said second colour level, or a further division into four quadrants using a same assignment criterion as in said stage c);
   e) iteration of said stage d) until quadrants with a dimension of one pixel are obtained with respect to dimensions of said device or implant;
   f) arbitrary assignment of a colour to all the quadrants that have same dimensions;
   g) calculation of a total number of quadrants that have been assigned said first colour level, corresponding to the areas of tissue with the greatest density of matter and expression said number of quadrants as a percentage of said image of the structure of said tissue, and the calculation of the number of quadrants for each recursion level and percentage weight of each recursion level with respect to the total number of quadrants; the calculation of the total number of quadrants that have been assigned said second colour level, corresponding to the areas of tissue with the least or no density of matter and expression said number of quadrants as a percentage of said image of the structure of said tissue, and the calculation of the number of quadrants for each recursion level and the percentage weight of each recursion level with respect to the total number of quadrants;
   i) analysis of the quadrants obtained at said previous stages, comprising determination of clusters of adjacent quadrants having said first colour level corresponding to the areas of tissue with the greatest density of matter, and of the clusters of adjacent quadrants having said second colour level corresponding to the areas of tissue with the least or no density of matter;
   l) generation of artificial clusters of quadrants having geometrical characteristics that reproduce or approximate characteristics of said clusters of adjacent quadrants described in stage i);
   m) designing a device and/or material for inserting or implanting in tissues of the human or animal body using characteristics established during said stage l).

2. A method according to claim 1, characterized in that the calculation of said colour level during said stage c) comprises the assignment of said first colour level if the image contains at least 90% of said first colour, or the assignment of said second colour level if the image contains no more than 5% of said first colour; or the division of said image into four quadrants if the image contains between 90% and 5% of said first colour level.

3. A method according to claim 1, characterized in that the calculation of said colour level during said stage c) comprises the assignment of said first colour level if the image contains at least 95% of said first colour, or the assignment of said second colour level if the image contains no more than 2% of said first colour; or the division of said image into four quadrants if the image contains between 95% and 2% of said first colour level.

4. A method according to claim 1, characterized in that said first colour level is white and said second colour level is black.

5. A method according to claim 1, characterized in that said quadrants of sufficiently limited dimensions with respect to the dimensions of said device or implant described in said stage e) have a minimum dimension of one pixel.

6. A method according to claim 1, characterized in providing the following stage:
- h) classification of said tissue in n classes, wherein n is a natural number, as a function of said percentage of areas of tissue with the greatest density of matter, of said percentage of areas of tissue with the least or no density of matter, and of percentage distribution of the quadrants of different dimensions obtained at the previous stages, wherein said stage h) is interposed between stages g) and stage i),
- wherein stage m) uses even the characteristics established during said stage h).

7. A method according to claim 6, characterized in that said stage h) comprises the classification of said tissue in n classes as a function of said percentage of areas of tissue with a high density of matter, where n comes between 2 and 12.

8. A method according to claim 7, characterized in that said stage h) comprises the classification of said tissue in n classes as a function of said percentage of areas of tissue having a high density of matter, where n comes between 3 and 8.

9. A method according to claim 1, characterized in that said device is a dental implant.

10. A method according to claim 1, characterized in that said device is a stent.

11. A method according to claim 1, characterized in that said material is a biomaterial for implanting in tissues of the human or animal body.

12. A method according to claim 1, characterized in that said material is a biomaterial for use in endogenous bone reconstruction.

13. A method according to claim 1, characterized in that said material is a filler biomaterial for use in endogenous bone reconstruction in odontoiatrics, maxillofacial surgery.

14. A method for selecting a device and/or material for implanting in tissues of a human or animal body, the method comprising:
- a) acquisition of an image of a structure of a human or animal tissue destined to receive a device and/or material, digital conversion of the image to create a digital image, said digital image identifying areas of tissue with different densities of matter;
- b) calibration of a colour level of said areas of tissue with different densities of matter, comprising an assignment of a first colour level to the areas of tissue with greatest density of matter (dmax) and a second colour level to the areas of tissue with least or no density of matter (dmin), values of said greatest density of matter (dmax) and said least or no density of matter (dmin) being referred to type and location of said tissue;
- c) calculation of the colour level of said image comprising the assignment of said first colour level if the image contains at least 60% of said first colour, or the assignment of said second colour level if the image contains no more than 40% of said first colour; or division of said image into four quadrants if the image contains between 60% and 40% of said first colour level;
- d) the calculation, where said image is divided into four quadrants, of the colour level of each of said four quadrants obtained at the previous stage c), comprising the assignment of said first colour level or of said second colour level, or a further division into four quadrants using a same assignment criterion as in said stage c);
- e) iteration of said stage d) until quadrants with a dimension of one pixel are obtained with respect to dimensions of said device or implant;
- f) arbitrary assignment of a colour to all the quadrants that have same dimensions;
- g) calculation of a total number of quadrants that have been assigned said first colour level, corresponding to the areas of tissue with the greatest density of matter and expression said number of quadrants as a percentage of said image of the structure of said tissue, and the calculation of the number of quadrants for each recursion level and percentage weight of each recursion level with respect to the total number of quadrants; the calculation of the total number of quadrants that have been assigned said second colour level, corresponding to the areas of tissue with the least or no density of matter and expression said number of quadrants as a percentage of said image of the structure of said tissue, and the calculation of the number of quadrants for each recursion level and the percentage weight of each recursion level with respect to the total number of quadrants;
- h) classification of said tissue in n classes, wherein n is a natural number, as a function of said percentage of areas of tissue with the greatest density of matter, of said percentage of areas of tissue with the least or no density of matter, and of percentage distribution of the quadrants of different dimensions obtained at the previous stages,
- i) analysis of the quadrants obtained at said previous stages, comprising determination of clusters of adjacent quadrants having said first colour level corresponding to the areas of tissue with the greatest density of matter, and of the clusters of adjacent quadrants having said second colour level corresponding to the areas of tissue with the least or no density of matter;
- l) selecting a device and/or material from a library of devices and/or materials.

15. A method according to claim 14, wherein said device is a dental implant.

16. A method according to claim 14, wherein said device is a filler biomaterial for use in endogenous bone reconstruction, particularly in odontoiatrics or maxillofacial surgery.

* * * * *